(12) United States Patent
Parkin

(10) Patent No.: US 7,666,467 B2
(45) Date of Patent: Feb. 23, 2010

(54) MAGNETIC TUNNEL JUNCTIONS USING AMORPHOUS MATERIALS AS REFERENCE AND FREE LAYERS

(75) Inventor: Stuart Stephen Papworth Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 11/928,602

(22) Filed: Oct. 30, 2007

(65) Prior Publication Data

US 2008/0182015 A1 Jul. 31, 2008

Related U.S. Application Data

(62) Division of application No. 10/904,449, filed on Nov. 10, 2004, now Pat. No. 7,351,483.

(51) Int. Cl.
*B05D 5/12* (2006.01)
*G11B 5/39* (2006.01)
*G11B 5/33* (2006.01)

(52) U.S. Cl. .................. 427/131; 427/132; 428/811.1; 428/811.2; 428/812; 428/816

(58) Field of Classification Search .......... 427/131, 427/132; 428/811.1, 811.2, 812, 816
See application file for complete search history.

(56) References Cited

U.S. PATENT DOCUMENTS

| | | | | |
|---|---|---|---|---|
| 6,674,617 | B2 * | 1/2004 | Gill | 360/324.12 |
| 6,767,655 | B2 * | 7/2004 | Hiramoto et al. | 428/811.2 |
| 7,252,852 | B1 | 8/2007 | Parkin | |
| 7,270,896 | B2 | 9/2007 | Parkin | |
| 7,274,080 | B1 | 9/2007 | Parkin | |
| 7,276,384 | B2 | 10/2007 | Parkin et al. | |
| 7,300,711 | B2 | 11/2007 | Parkin | |
| 7,345,855 | B2 | 3/2008 | Parkin | |
| 7,349,187 | B2 | 3/2008 | Parkin | |
| 7,351,483 | B2 | 4/2008 | Parkin | |
| 7,357,995 | B2 | 4/2008 | Parkin | |
| 7,443,639 | B2 | 10/2008 | Parkin | |
| 2002/0055016 | A1 * | 5/2002 | Hiramoto et al. | 428/692 |
| 2002/0114112 | A1 | 8/2002 | Nakashio et al. | |
| 2003/0008416 | A1 | 1/2003 | Shimura et al. | |
| 2003/0169542 | A1 * | 9/2003 | Gill | 360/324.2 |
| 2007/0259213 | A1 | 11/2007 | Hashimoto et al. | |
| 2008/0138660 | A1 | 6/2008 | Parkin | |

(Continued)

OTHER PUBLICATIONS

Butler et al.; "Spin-dependant tunneling conductance of /Fe/Mg/Fe sandwiches"; (Phys. Rev. B, 63, Jan. 2001, pp. 054416-1-054416-12).*

(Continued)

*Primary Examiner*—Timothy H Meeks
*Assistant Examiner*—Mandy C Louie
(74) *Attorney, Agent, or Firm*—Daniel E. Johnson

(57) ABSTRACT

Magnetic tunnel junctions are constructed from a MgO or Mg—ZnO tunnel barrier and amorphous magnetic layers in proximity with, and on respective sides of, the tunnel barrier. The amorphous magnetic layer preferably includes Co and at least one additional element selected to make the layer amorphous, such as boron. Magnetic tunnel junctions formed from the amorphous magnetic layers and the tunnel barrier have tunneling magnetoresistance values of up to 200% or more.

21 Claims, 20 Drawing Sheets

U.S. PATENT DOCUMENTS

| | | |
|---|---|---|
| 2008/0145952 A1 | 6/2008 | Parkin |
| 2008/0182015 A1 | 7/2008 | Parkin |
| 2008/0182342 A1 | 7/2008 | Parkin |
| 2008/0291584 A1 | 11/2008 | Parkin |

OTHER PUBLICATIONS

Nishimura et al.; Magnetic tunnel junction device with perpendicular magnetization films for high-density magnetic random access memory; (J. App. Phys., v91(8), Apr. 2002, pp. 5246-5249).*

Yuasa et al., "Giant room-temperature magnetoresistance in single-crystal Fe/MgO/Fe magnetic tunnel junctions", Nature Materials, Oct. 31, 2004, pp. 868-871, vol. 3, Nature Publishing Group.

Parkin et al., "Giant tunnelling magnetoresistance at room temperature with MgO (100) tunnel barriers", Nature Materials, Oct. 31, 2004, pp. 862-867, vol. 3, Nature Publishing Group.

U.S. Appl. No. 12/554,420, filed Sep. 4, 2009, Stuart Parkin.

* cited by examiner

MAGNETIC TUNNEL JUNCTIONS USING AMORPHOUS MATERIALS AS REFERENCE AND FREE LAYERS

This application is a divisional of, and claims priority to, Applicant's co-pending application Ser. No. 10/904,449 filed Nov. 10, 2004 and entitled "Magnetic Tunnel Junctions Using Amorphous Materials as Reference and Free Layers", which is hereby incorporated by reference.

The U.S. Government has a paid-up license in this invention and the right in limited circumstances to require the patent owner to license others on reasonable terms as provided for by the terms of contract MDA972-99-C-0009 awarded by DARPA.

TECHNICAL FIELD

The invention relates to magnetic tunnel junction (MTJ) magnetoresistive (MR) devices for use as magnetic field sensors such as read heads for reading magnetically recorded data, as memory cells in nonvolatile magnetic random access memory (MRAM) cells, and for magnetic logic and spintronic applications. More particularly, this invention relates to an improved MTJ exhibiting high tunneling magnetoresistance with one or more electrodes formed from amorphous ferromagnetic materials.

BACKGROUND OF THE INVENTION

The basic component of a magnetic tunnel junction is a sandwich of two thin ferromagnetic and/or ferrimagnetic layers separated by a very thin insulating layer through which electrons can tunnel. The tunneling current is typically higher when the magnetic moments of the ferromagnetic (F) layers are parallel and lower when the magnetic moments of the two ferromagnetic layers are anti-parallel. The change in conductance for these two magnetic states can be described as a magneto-resistance. Here the tunneling magnetoresistance (TMR) of the MTJ is defined as $(R_{AP}-R_P)/R_P$ where $R_P$ and $R_{AP}$ are the resistance of the MTJ for parallel and anti-parallel alignment of the ferromagnetic layers, respectively. MTJ devices have been proposed as memory cells for nonvolatile solid state memory and as external magnetic field sensors, such as TMR read sensors for heads for magnetic recording systems. For a memory cell application, one of the ferromagnetic layers in the MTJ is the reference layer and has its magnetic moment fixed or pinned, so that its magnetic moment is unaffected by the presence of the magnetic fields applied to the device during its operation. The other ferromagnetic layer in the sandwich is the storage layer, whose moment responds to magnetic fields applied during operation of the device. In the quiescent state, in the absence of any applied magnetic field within the memory cell, the storage layer magnetic moment is designed to be either parallel (P) or anti-parallel (AP) to the magnetic moment of the reference ferromagnetic layer. For a TMR field sensor for read head applications, the reference ferromagnetic layer has its magnetic moment fixed or pinned so as to be generally perpendicular to the magnetic moment of the free or sensing ferromagnetic layer in the absence of an external magnetic field. The use of an MTJ device as a memory cell in an MRAM array is described in U.S. Pat. No. 5,640,343. The use of an MTJ device as a MR read head has been described in U.S. Pat. Nos. 5,390,061; 5,650,958; 5,729,410 and 5,764,567.

FIG. 1A illustrates a cross-section of a conventional prior-art MTJ device. The MTJ 100 includes a bottom "fixed" or "reference" ferromagnetic (F) layer 15, an insulating tunnel barrier layer 24, and a top "free" or "storage" ferromagnetic layer 34. The MTJ 100 has bottom and top electrical leads 12 and 36, respectively, with the bottom lead being formed on a suitable substrate 11, such as a silicon oxide layer. The ferromagnetic layer 15 is called the fixed (or reference) layer because its magnetic moment is prevented from rotating in the presence of an applied magnetic field in the desired range of interest for the MTJ device, e.g., the magnetic field caused by the write current applied to the memory cell from the read/write circuitry of the MRAM. The magnetic moment of the ferromagnetic layer 15, whose direction is indicated by the arrow 90 in FIG. 1A, can be fixed by forming it from a high coercivity magnetic material or by exchange coupling it to an antiferromagnetic layer 16. The magnetic moment of the free ferromagnetic layer 34 is not fixed, and is thus free to rotate in the presence of an applied magnetic field in the range of interest. In the absence of an applied magnetic field, the moments of the ferromagnetic layers 15 and 34 are aligned generally parallel (or anti-parallel) in an MTJ memory cell (as indicated by the double-headed arrow 80 in FIG. 1A) and generally perpendicular in a MTJ magnetoresistive read head. The relative orientation of the magnetic moments of the ferromagnetic layers 15, 34 affects the tunneling current and thus the electrical resistance of the MTJ device. The bottom lead 12, the antiferromagnetic layer 16, and the fixed ferromagnetic layer 15 together may be regarded as constituting the lower electrode 10.

The basic concept of a magnetic tunnel junction was first realized in 1975 (M. Julliére, "Tunneling between ferromagnetic films", Phys. Lett. 54A, 225 (1975)), although the TMR was very small and observed only at low temperatures and for very small bias voltages. In 1995 significant TMR effects of about 10% were obtained at room temperature in MTJs with $Al_2O_3$ tunnel barriers by two different groups (J. S. Moodera et al., "Large magnetoresistance at room temperature in ferromagnetic thin film tunnel junctions", Phys. Rev. Lett. 74, 3273 (1995); and T. Miyazaki and N. Tezuka, "Giant magnetic tunneling effect in $Fe/Al_2O_3/Fe$ junction", J. Magn. Magn. Mat. 139, L231 (1995)). Subsequently, S. S. P. Parkin et al. ("Exchange-biased Magnetic Tunnel Junctions and Application to Non-Volatile Magnetic Random Access Memory", J. Appl. Phys. 85, 5828 (1999)) obtained effects as large as about 48-50% by optimizing the growth of the $Al_2O_3$ tunnel barrier, by optimizing the interface between the $Al_2O_3$ tunnel barrier and the ferromagnetic electrodes, and by carefully controlling the magnetic orientation of the ferromagnetic moments using concepts of magnetic engineering, in particular, exchange bias (see U.S. Pat. No. 5,650,958 titled "Magnetic tunnel junctions with controlled magnetic response" to Gallagher et al.) and an anti-parallel coupled pinned ferromagnetic layer (see U.S. Pat. No. 5,841,692 titled "Magnetic tunnel junction device with antiferromagnetically coupled pinned layer" to Gallagher et al.).

The magnetoresistance of MTJs using aluminum oxide tunneling barriers is limited to about 50% at room temperature (S. S. P. Parkin et al., "Exchange-biased Magnetic Tunnel Junctions and Application to Non-Volatile Magnetic Random Access Memory", J. Appl. Phys. 85, 5828 (1999); X.-F. Han et al., "Fabrication of high-magnetoresistance tunnel junctions using $CO_{75}Fe_{25}$ ferromagnetic electrodes", Appl. Phys. Lett. 77, 283 (2000)), although there have been reports of TMR values of up to about 58% at room temperature (M. Tsunoda et al., "60% magnetoresistance at room temperature in Co—Fe/Al—O/Co—Fe tunnel junctions oxidized with Kr—O2 plasma", Appl. Phys. Lett. 80, 3135 (2002)).

For applications of magnetic tunnel junctions for either magnetic recording heads or for non-volatile magnetic memory storage cells, high TMR values are needed for improving the performance of these devices. The speed of operation of the recording head or memory is related to the signal to noise ratio (SNR) provided by the MTJ—higher TMR values will lead to higher SNR values for otherwise the same resistance. Moreover, for memory applications, the larger the TMR, the greater is the variation in resistance of the MTJs from device to device which can be tolerated. Since the resistance of an MTJ depends exponentially on the thickness of the tunneling barrier, small variations in thickness can give rise to large changes in the resistance of the MTJ. Thus high TMR values can be used to mitigate inevitable variations in tunnel barrier thickness from device to device. The resistance of an MTJ device increases inversely with the area of the device. As the density of memory devices increases in the future, the thickness of the tunnel barrier will have to be reduced (for otherwise the same tunnel barrier material) to maintain an optimal resistance of the MTJ memory cell for matching to electronic circuits. Thus a given variation in thickness of the tunnel barrier (introduced by whatever process is used to fabricate the MTJ) will become an increasingly larger proportion of the reduced tunnel barrier thickness and so will likely give rise to larger variations in the resistance of the MTJ device.

U.S. patent application Ser. No. 10/824,835 to Parkin titled "MgO tunnel barriers and method of formation" (filed Apr. 14, 2004), which is hereby incorporated by reference, discloses a method of forming a tunnel barrier comprised of magnesium oxide (MgO) with which magnetic tunnel junctions can be deposited which exhibit tunneling magnetoresistance values of more than 100% at low bias. The tunnel barrier is formed by first depositing a thin layer of Mg using, for example, magnetron or ion beam sputter deposition followed by a layer of Mg deposited in the presence of oxygen. In addition, Parkin discloses methods of forming highly oriented crystalline MgO tunnel barriers by forming the MgO barrier on a ferromagnetic electrode comprised of a Co—Fe alloy, which is bcc and (100) textured. The CoFe electrode is formed on a (100) oriented antiferromagnetic layer of fcc IrMn which itself is grown highly oriented by forming this layer on suitable underlayers, for example, a combination of a TaN layer followed by a Ta layer.

Useful MTJ devices for magnetic recording read heads or for MRAM memory cells will be of sub-micron dimensions. This leads to very large self-demagnetizing for devices which are not circular in cross-section and very large magnetostatic coupling fields between ferromagnetic layers in the same device. For example, in the conventional device shown in FIG. 1A, there will be a very large interaction between the pinned ferromagnetic layer 15 and the free or storage ferromagnetic layer 34 because of magnetic poles formed at the edges of the device 100. These coupling fields are so large as to make such devices typically unworkable because the direction of the magnetic moment of the storage layer 34, indicated by the arrow 80 in FIG. 1A, will preferentially be oriented antiparallel to that of the direction of the magnetic moment of the fixed ferromagnetic layer 15, indicated by the arrow 90 in FIG. 1A. One method to solve this problem was first proposed by Parkin and Heim with reference to metallic spin-valve giant magnetoresistance sensors in U.S. Pat. No. 5,465,185, wherein the reference ferromagnetic layer 15 is replaced by a sandwich of two ferromagnetic layers 18 and 19 antiferromagnetically coupled through a metallic spacer layer 17 as shown by the MTJ 100' of FIG. 1B. The lower electrode is now given by the reference numeral 10', and the magnetic orientation of the layers 18 and 19 is given by the arrows 90' and 95, respectively. Parkin showed that the spacer layer can be comprised of a wide variety of non-magnetic metals chosen from the groups of the 3d, 4d, and 5d transition metals as well as the noble metals, Cu, Au and Ag such that the layers 18 and 19 are indirectly exchange coupled through the metallic spacer layer 17 (S. S. P. Parkin et al. "Oscillations in Exchange Coupling and Magnetoresistance in Metallic Superlattice Structures: Co/Ru, Co/Cr and Fe/Cr", Phys. Rev. Lett. 64, 2304 (1990) and S. S. P. Parkin, "Systematic Variation of Strength and Oscillation Period of Indirect Magnetic Exchange Coupling through the 3d, 4d and 5d Transition Metals", Phys. Rev. Lett. 67, 3598 (1991)). For certain thicknesses of the spacer layer 17, the magnetic moments of the ferromagnetic layers 18 and 19 are antiferromagnetically coupled to one another so that the net magnetic moment of the sandwich can be chosen to be arbitrarily small. Consequently, the demagnetization field from the edges of the layer 18 is reduced by the opposite demagnetizing field arising from the poles at the edges of the layer 19. The net demagnetizing field can be zero by proper choice of the thicknesses and the magnetic material forming layers 18 and 19. In particular Parkin (S. S. P. Parkin et al. "Oscillations in Exchange Coupling and Magnetoresistance in Metallic Superlattice Structures: Co/Ru, Co/Cr and Fe/Cr", Phys. Rev. Lett. 64, 2304 (1990)) showed that Ru is a highly preferred antiferromagnetic coupling layer because of the large antiferromagnetic (AF) coupling strength exhibited by very thin layers of Ru and because Ru displays large AF coupling for a wide range of ferromagnetic materials. Moreover, structures using Ru antiferromagnetic coupling layers also display high thermal stability. For these reasons the synthetic antiferromagnetic structure formed from the combination of ferromagnetic layers 18 and 19 separated by a thin Ru layer 17 has become the de facto structure of choice for magnetic recording read heads based on giant magnetoresistance as well as for magnetic tunnel junction memory cells based on spin dependent tunneling using amorphous alumina tunnel barriers. The use of synthetic antiferromagnetic reference layers using Ru antiferromagnetic coupling layers for MTJ sensor and memory applications is described in U.S. Pat. No. 5,841,692 titled "Magnetic tunnel junction device with antiferromagnetically coupled pinned layer" to Gallagher et al.

However, MTJs with MgO tunnel barriers and synthetic antiferromagnetic reference layers using Ru antiferromagnetic coupling layers do not exhibit the high tunneling magnetoresistance values exhibited by similar MTJs without the synthetic antiferromagnetic reference layer. MTJs without a synthetic antiferromagnetic reference layer suffer from the presence of unwanted coupling fields, as discussed above, since the storage magnetic layer moment has a tendency to be aligned anti-parallel to the reference layer magnetic moment. Alternative materials and structures are needed for the preparation of MTJ devices with high tunneling magnetoresistance.

In a cross-point MRAM the MTJ devices are switched by the application of two magnetic fields applied along two orthogonal directions, the easy and hard axes of the MTJ device. Typically the magnetic easy and hard anisotropy axes are defined by the shape of the MTJ element through the self demagnetizing fields. The MRAM array will contain a series of MTJ elements arranged along a series of word and bit lines, typically arranged orthogonal to one another. The magnetic switching fields are realized by passing currents along the word and bit lines. All the cells along a particular word or bit line will be subject to the same word or bit line field. Thus the width of the distribution of switching fields for the selected MTJs (those subject to the vector sum of the bit and word line fields) must be sufficiently narrow that it does not overlap the distribution of switching fields for the half-selected devices. The moment within the MTJ devices lies along a particular direction, the easy axis. The orthogonal direction is the magnetic "hard" axis.

One of the most challenging problems for the successful development of MTJ memory storage cells is to obtain sufficiently uniform switching fields for a large array of MTJ cells. The switching field will depend on the detailed structure, size and shape of the individual MTJ cells. In particular, the switching characteristics of the storage layer will be influenced by the detailed crystallographic structure of this layer. The storage layer will be formed from a multilayered stack of thin layers comprising both ferromagnetic and non-ferromagnetic materials. Typically the storage layer will be polycrystalline, i.e., comprised of grains of crystalline material having a lateral extent in the range of 100 to 500 angstroms. The ferromagnetic materials will likely exhibit magnetocrystalline anisotropy whereby the magnetization within a grain will prefer to lie along a particular crystallographic direction within the grain. Since the crystalline orientation of the grains which comprise the ferromagnetic layer will vary randomly from grain to grain, the preferred orientation of the magnetic moment will also vary in direction from grain to grain—this direction can be in the plane of the film or could be at an angle out of or into the plane of the film.

For grains which are strongly exchange coupled, the magnetic moment of the ferromagnetic layer will exhibit a preferred direction determined by averaging over the contributions from the various grains. For a MTJ device comprised of a great number of grains, the contribution of any individual grain is small. However, as the size of the MTJ storage cell is shrunk, the number of crystalline grains will also be reduced, assuming the grain size is unchanged, so that eventually the properties of individual cells may depend on the properties of a small number of grains. This would lead to variations in magnetic switching field from device to device, which can reduce the write margin. One means of mitigating this problem might be to reduce the size of the crystalline grains within the MTJ storage cell storage layer or, alternatively, to eliminate the grains altogether by forming the storage layer from amorphous ferromagnetic (or ferrimagnetic) materials as described in U.S. patent application Ser. No. 10/720,962 to Parkin and Samant titled "Magnetic tunnel junction with improved tunneling magneto-resistance" (filed Nov. 24, 2003), which is hereby incorporated by reference.

While forming the storage layer within the MTJ memory cell from amorphous magnetic materials would have the advantage of reducing the variation in magnetic switching fields, it is in general desirable for the MTJ to exhibit the largest possible tunneling magnetoresistance, so as to allow for unavoidable cell-to-cell variations in resistance of the MTJ devices within an MRAM array of cells. The methods of forming MTJs with high tunneling magnetoresistance values described in U.S. patent application Ser. No. 10/824,835 to Parkin titled "MgO tunnel barriers and method of formation" (filed Apr. 14, 2004) lead to MTJs which are polycrystalline and highly textured. The high tunneling magnetoresistance requires that the MgO tunnel barrier be simple cubic and preferably (100) textured and surrounded on both sides by ferromagnetic layers which are bcc and preferably (100) textured. The highly textured nature of the MTJ cell means that the easy axis of magnetization will lie preferentially within the plane of the MTJ storage layer. This means that the variation in magnetocrystalline anisotropy field will be typically larger from device to device than would be the case if the storage layer was poorly textured, so that the easy axis of magnetization preferentially would not be within the plane of the storage layer. Therefore, the highly textured structure of MTJs with MgO tunnel barriers which exhibit high tunneling magnetoresistance is likely to lead to large variations in magnetic switching fields from device to device. Since the high tunneling magnetoresistance properties of the MTJs depends on the highly textured crystallographic orientation of the MTJ cell, the use of amorphous ferromagnetic layers, which would likely give rise to smaller variations in magnetic switching fields, would appear to be incompatible with the structural requirements of high TMR MTJ devices.

What is needed is a method of forming MTJs with high tunneling magnetoresistance with improved magnetic switching characteristics.

SUMMARY OF THE INVENTION

A preferred first embodiment of the invention is a structure that includes a first amorphous magnetic layer and a second amorphous magnetic layer, both of which include material selected from the group consisting of ferromagnetic materials and ferrimagnetic materials. The structure further includes at least one tunnel barrier selected from the group of tunnel barriers consisting of MgO and Mg—ZnO, in which the tunnel barrier is located between the first amorphous magnetic layer and the second amorphous magnetic layer. The structure also includes an antiferromagnetic layer that exchange biases the second amorphous magnetic layer. The first amorphous magnetic layer, the second amorphous magnetic layer, and the tunnel barrier are in proximity with each other, thereby enabling spin-polarized current to pass between the first and second amorphous magnetic layers (through the tunnel barrier). The antiferromagnetic layer preferably includes at least one of IrMn and PtMn, and the thickness of this layer is advantageously between 75 and 300 angstroms. For optimum performance, the tunnel barrier is preferably (100) oriented and may be in direct contact with each of the first and second amorphous magnetic layers. The tunnel barrier may advantageously be crystalline, for example, it may include polycrystalline grains.

One or both of the amorphous magnetic layers may advantageously include an alloy of Co and Fe. Also, one or both of the amorphous magnetic layers preferably includes Co and at least one additional element selected to make the layer amorphous, such as B, Zr, Hf, and Si. If boron is used, then the Co to Fe ratio is preferably chosen so that the alloy would form a bcc-crystal structure in the absence of B; the B content is preferably between 10 and 30 atomic percent, more preferably between 10 and 25 atomic percent, and still more preferably between 15 and 20 atomic percent. In a preferred embodiment, there is a magnetic, crystalline interface layer between the tunnel barrier and one of the amorphous layers. More preferably, there is a first magnetic crystalline layer between and in contact with both the tunnel barrier and the first amorphous magnetic layer, and there is a second magnetic crystalline layer between and in contact with both the tunnel barrier and the second amorphous magnetic layer. These crystalline layers may advantageously include an alloy of Co and Fe.

In a preferred first embodiment, there is a capping layer over the first amorphous magnetic layer and a substrate under the antiferromagnetic layer. The first amorphous magnetic layer, the tunnel barrier, and the second amorphous magnetic layer may advantageously form a magnetic tunnel junction having a room temperature tunnel magnetoresistance of at least 50%, more preferably at least 100%, still more preferably at least 160%, and most preferably at least 200%.

A preferred second embodiment of the invention is structurally similar to the first except that the antiferromagnetic layer (which in the first embodiment exchange biases the second amorphous magnetic layer) is replaced with the following: i) an additional magnetic layer in proximity with the second amorphous magnetic layer and ii) an antiferromagnetic coupling layer that couples the second amorphous magnetic layer and the additional magnetic layer, so that the magnetic moments of the second amorphous magnetic layer and the additional magnetic layer are antiparallel (or nearly antiparallel) in the absence of an external magnetic field. In this case, the additional magnetic layer, the antiferromagnetic coupling layer, and the second amorphous magnetic layer form a synthetic antiferromagnet reference layer. The antiferromagnetic coupling layer may underlie and be in contact with the second amorphous layer, and the additional magnetic layer may underlie and be in contact with the coupling layer. The second embodiment may further include an antiferromagnetic layer in proximity with the synthetic antiferromagnetic layer, e.g., the antiferromagnetic layer may advantageously include at least one of IrMn and PtMn. The antiferromagnetic coupling layer is preferably conducting and may include Ru, Os, or at least one alloy from the group consisting of Ru alloys and Os alloys. The additional magnetic layer may include an alloy of Co and Fe, which may be amorphous magnetic material, and the Fe concentration of the additional magnetic layer may advantageously be between 10 and 30 percent.

A preferred aspect of the invention is a method that includes forming a MgO or Mg—ZnO tunnel barrier. The method further includes forming first and second amorphous ferromagnetic layers by depositing Co and at least one other element on respective underlayers, in which the amorphous layers and the tunnel barrier are formed in proximity to one another to permit spin-polarized current to pass between the first and second amorphous layers (through the tunnel barrier), thereby forming a magnetic tunnel junction. The method further includes forming in proximity with the second amorphous layer at least one of the following: i) an antiferromagnetic layer that exchange biases the second amorphous magnetic layer, and ii) an additional magnetic layer and an antiferromagnetic coupling layer in proximity with the second amorphous magnetic layer, so that the additional magnetic layer, the coupling layer, and the second amorphous magnetic layer form a synthetic antiferromagnet reference layer, in which the coupling layer couples the second amorphous magnetic layer and the additional magnetic layer. The said at least one other element may include B, Zr, Hf, and/or Si. The amorphous ferromagnetic layers may also include respective thin crystalline layers that are in contact with the tunnel barrier.

The tunnel barrier may be advantageously formed directly on one of the amorphous ferromagnetic layers, and at least one of the amorphous ferromagnetic layers may be advantageously formed directly on the tunnel barrier. The tunnel barrier is preferably (100) oriented, and the magnetic tunnel junction is preferably annealed to improve its tunneling magnetoresistance, e.g., it may be annealed at a temperature selected to yield a tunnel magnetoresistance of greater than 50% at room temperature, greater than 100% at room temperature, greater than 160% at room temperature, or even greater than 200% at room temperature. For example, the junction may be annealed at a temperature greater than 300° C., greater than 340° C., or in the range of 300° C. to 400° C.

In one preferred implementation of the method, the tunnel barrier includes a MgO tunnel barrier. The MgO tunnel barrier is preferably formed by depositing Mg onto a surface of an underlayer to form a Mg layer thereon, in which the surface is selected to be substantially free of oxide, and directing additional Mg, in the presence of oxygen, towards the Mg layer to form a MgO tunnel barrier in contact with the oxide-free underlayer, with the oxygen reacting with the additional Mg and the Mg layer.

In another preferred implementation of the method, the tunnel barrier includes a Mg—ZnO tunnel barrier. The Mg—ZnO tunnel barrier is preferably formed by depositing a metal layer onto a surface of an underlayer, in which the surface is selected to be substantially free of oxide, and directing additional metal towards the metal layer, in the presence of oxygen, to form a magnesium-zinc oxide tunnel barrier in contact with the oxide-free underlayer, with the oxygen reacting with the additional metal and the metal layer. At least one of the metal layer and the additional metal includes Zn, and at least one of the metal layer and the additional metal includes Mg.

The MgO and Mg—ZnO tunnel barriers of the magnetic tunnel junction devices disclosed herein are preferably prepared according to methods in which the lower ferromagnetic (or ferrimagnetic) electrode is not oxidized, so as to give much higher tunnel magnetoresistance values than in the prior art. Similarly, much higher spin polarization values of tunneling current are obtained in tunnel junction devices with one or more ferromagnetic (or ferrimagnetic) electrodes. The MgO or Mg—ZnO tunnel barrier so formed does not have a significant number of defects that would otherwise lead to hopping conductivity through the tunnel barrier. In preferred methods, highly oriented (100) MgO or Mg—ZnO barriers are formed without using single crystalline substrates or high deposition temperatures, thereby facilitating the manufacture of devices using standard deposition techniques on polycrystalline or amorphous films. Post anneal treatments are preferred to improve the tunneling magnetoresistance, which for the MgO structures disclosed herein can exceed 50, 100, 160 or even 200% at room temperature, and which for the Mg—ZnO structures disclosed herein can exceed 50% at room temperature.

For several aspects and embodiments of the invention disclosed herein, a MgO or Mg—ZnO tunnel barrier is sandwiched between an underlayer and an overlayer, either one or both of which may include one or more layers of a ferromagnetic material and/or a ferrimagnetic material. While the MgO (or Mg—ZnO) tunnel barrier is preferably in direct contact with the ferromagnetic material and/or ferrimagnetic material, each of the underlayer and overlayer may optionally include one or more spacer layers which are adjacent to the tunnel barrier but which do not significantly affect the tunneling properties of the MgO (or Mg—ZnO) layer, e.g., by not significantly diminishing the spin polarization of electrons tunneling through the tunnel barrier. For example, Au or Cu may be used as non-magnetic spacer layers. (It should be understood that the terms underlayer and overlayer do not necessarily imply any particular orientation with respect to gravity.)

Performance of the MgO (or Mg—ZnO) tunnel barriers disclosed herein may be improved through annealing, wherein performance refers to various attributes of the tunnel barrier or associated device. For example, annealing a magnetic tunnel junction improves, in particular, its magneto-tunneling resistance; annealing a tunnel barrier improves, in particular, its spin polarization. In particular by annealing these tunnel barriers, tunneling magneto-resistance of more than 100% can readily be achieved using methods of thin film deposition and substrate materials compatible with conventional manufacturing technologies. Annealing temperatures may be in the range from 200° C. to 400° C.; however, the best tunnel barrier performance was obtained for annealing temperatures in the range from 300° C. to 400° C. The same anneal that improves the tunneling magnetoresistance may also be used to set the direction of an optional exchange bias field provided by an antiferromagnetic exchange bias layer.

The preferred embodiments and implementations herein are directed to structures using amorphous magnetic materials; any non-amorphous magnetic material preferably has a body-centered cubic (bcc) lattice, since this lattice type leads to the best performance of the MgO or Mg—ZnO tunnel barrier (e.g., the highest TMR for a tunnel junction). It should be noted, however, that in thin films, because of strain induced by overlayers and/or underlayers, the in-plane and out-of-plane lattice constants may be slightly different, and the lattice may be slightly distorted from the pure bcc case, e.g., as a result of a tetragonal distortion. As used herein, the term "body centered cubic" (bcc) should be construed broadly enough to encompass such deviations from the pure bcc case.

The preferred embodiments and implementations of the invention are directed to MgO or Mg—ZnO tunnel barrier layers which are substantially (100) oriented or textured. Certain non-amorphous magnetic layers and tunnel barrier layers are polycrystalline and are comprised of grains or crystallites which range in lateral extent from approximately one hundred to several hundred angstroms (e.g., 500 angstroms). Thus, these layers and the overall film structure are what is commonly referred to as textured. Texturing implies that there is a predominant crystallographic orientation of individual layers and/or the overall film structure, but that the grains are not perfectly aligned along one particular direction. Individual grains may not be precisely oriented with their (100) direction along the normal to the film layer, but the (100) direction within individual grains may be oriented away from the normal to the plane of the film by an angle that can vary from a small fraction of one degree to several degrees or even tens of degrees for poorly textured films. The angular range of these (100) directions can be used to quantify the degree of (100) crystalline texture of the film structure and can be measured using various structural characterization techniques, including cross-section transmission electron microscopy and various x-ray diffraction techniques. There may also be present grains which are oriented in a completely different direction, but the proportion of these grains is small for the method of formation of the magnetic tunnel junction structures described herein. Note that the crystalline grains are randomly oriented with respect to a direction within the plane of the substrate on which the film structures are grown. It is the orientation or texturing of the film which is important with regard to the preferred embodiments herein. Whereas the maximum TMR is obtained for film structures which are highly textured, the TMR will be increased to the extent that the film structure is textured. It is preferred that the angular range of a (100) direction within the grains be within + or −20 degrees of the film normal, or more preferably within + or −10 degrees, and even more preferably within + or −5 degrees. As used herein, the term "(100) oriented" should be understood to include the aforementioned deviations from the ideal case, in which all the grains are precisely oriented with their (100) direction along the normal to the film layer.

For a fuller understanding of the nature and advantages of the present invention, reference should be made to the following detailed description taken together with the accompanying figures.

BRIEF DESCRIPTION OF THE DRAWINGS

FIG. 1, which includes FIG. 1A shows a magnetic tunnel junction with a reference and a storage ferromagnetic layer, and FIG. 1B shows a magnetic tunnel junction device with a reference layer (formed from a synthetic antiferromagnet) and a storage ferromagnetic layer.

FIGS. 4A and 4B, shows the dependence of tunneling magnetoresistance on the applied magnetic field in the plane of a magnetic tunnel junction device for the structure shown in FIG. 3A annealed at various temperatures indicated in the Figure. FIG. 4A shows a sequence of major loops and FIG. 4B shows a sequence of minor loops at room temperature after an anneal treatment at each of the indicated temperatures.

FIGS. 5A and 5B, shows the dependence of the tunneling magnetoresistance (in FIG. 5A) and the resistance-area product (in FIG. 5B) as a function of anneal temperature for an MTJ of the present invention.

FIGS. 8A and 8B, shows the dependence of tunneling magnetoresistance on the applied magnetic field in the plane of two magnetic tunnel junction devices for the structure shown in FIG. 7. FIG. 8A shows a major loop and FIG. 8B shows a minor loop for each junction at room temperature.

FIGS. 9A and 9B, shows the dependence of the tunneling magnetoresistance (in FIG. 9A) and the antiferromagnetic coupling field (in FIG. 9B) for various MTJs of the present invention with two different Co—Fe alloy layer compositions, as a function of thickness of the Cr—Mo antiferromagnetic coupling layer for two different Cr—Mo compositions.

FIG. 10A shows major loops, and FIG. 10B shows minor loops.

FIGS. 12A and 12B, shows the dependence of the tunneling magnetoresistance as a function of magnetic field in the plane of the junction for an MTJ of the present invention at room temperature. Minor loops for the same junction annealed at 260° C. and 380° C. are shown in FIG. 12A. A major loop is shown in FIG. 12B for the junction after annealing at 380° C.

FIGS. 13A and 13B, shows the dependence of the tunneling magnetoresistance (in FIG. 13A) and the resistance (in FIG. 13B) as a function of anneal temperature for an MTJ of the present invention.

DESCRIPTION OF THE PREFERRED EMBODIMENTS

Figure 1A:
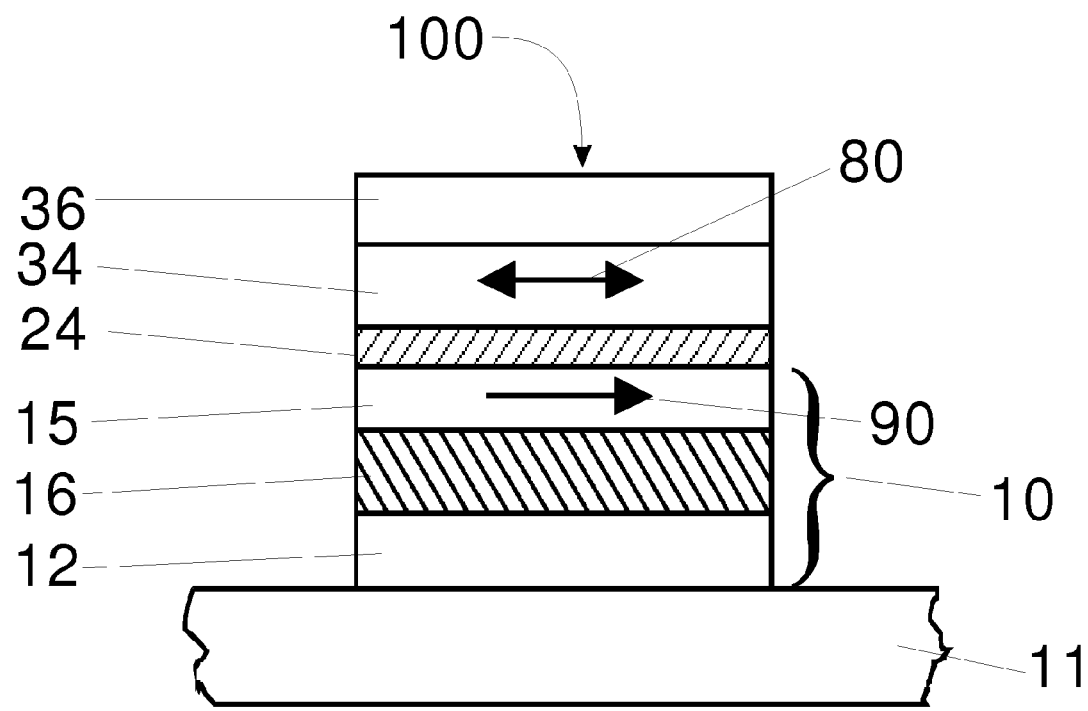
FIGS. 1A and 1B, is a schematic of a magnetic tunnel junction formed in accordance with the prior art.

The tunneling current in an MTJ is spin polarized, which means that the electrical current passing from one of the ferromagnetic layers is predominantly composed of electrons of one spin type (spin up or spin down, depending on the orientation of the magnetization of the ferromagnetic layer). The tunneling spin polarization P of the current can be inferred from a variety of different measurements. The measurement most relevant to magnetic tunneling is to measure the conductance as a function of bias voltage for junctions formed from a sandwich of the ferromagnetic material of interest and a superconducting counter electrode (R. Meservey and P. M. Tedrow, Phys. Rep. 238, 173 (1994)). These studies show that the spin polarization of the tunnel current measured in this way can be simply related to the TMR close to zero bias voltage as first proposed by Julliére (M. Julliére, Phys. Lett. 54A, 225 (1975)). In such a model P is defined as $(n_\uparrow - n_\downarrow)/(n_\uparrow + n_\downarrow)$, where $n\uparrow$ and $n\downarrow$ are the density of spin up and spin down states at the ferromagnet/insulator interface. By assuming that the tunnel current is comprised of two independent majority and minority spin currents and that these currents are related to the respective density of states of the majority and minority carriers in the opposing ferromagnetic electrodes, the TMR can be formulated by the relation $TMR=(R_{AP}-R_P)/R_P=2P_1P_2/(1-P_1P_2)$, where $R_{AP}$ and $R_P$ are the resistance of the MTJ for anti-parallel and parallel orientation of the ferromagnetic electrodes, respectively, and $P_1$ and $P_2$ are the spin polarization values of the two ferromagnetic electrodes. Experimentally, it is clear that the magnitude of the TMR is extremely sensitive to the nature of the interface between the tunneling barrier and the ferromagnetic electrode. By changing the properties of the interface layer, for example, by inserting very thin layers of non-magnetic metals between the ferromagnet and the insulator layers, the TMR can be dramatically altered. Based on such observations, most experimental data on magnetic tunneling have usually been interpreted by assuming that P is largely determined by the electronic structure of the ferromagnetic interface layer essentially independent of the tunnel barrier electronic structure. However, it is now recognized that P can be strongly influenced by the probability of tunneling of electrons which depends not only on their spin but also on the tunneling matrix element. The tunneling matrix element is determined by the detailed electronic structure of the ferromagnetic, the tunnel barrier and that of the interface between the ferromagnetic electrode and the tunnel barrier. For the same ferromagnetic electrode, the polarization of the tunneling current P varies depending on the material and structure of the tunnel barrier.

The possibility of high tunneling magnetoresistance in MTJs formed from epitaxial Fe/MgO/Fe sandwiches where the tunnel barrier is formed from crystalline (100) oriented MgO layers was theorized by W. H. Butler, X.-G. Zhang, T. C. Schulthess et al., Phys. Rev. B 63, 054416 (2001). The high TMR results from the very slow decay through the tunnel barrier of majority electrons of a particular symmetry for the (100) orientation of Fe/MgO. This also means that the polarization of the tunneling electrons should also be very high. However, extensive experimental work by many groups over a period of several years showed no evidence for improved tunneling magnetoresistance values using crystalline (100) MgO tunnel barriers as compared to amorphous alumina tunnel barriers. It was speculated that during the formation of the MgO tunnel barrier, the surface of the lower Fe electrode became oxidized perhaps resulting in much lower TMR than theorized. In U.S. patent application Ser. No. 10/824,835 to Parkin titled "MgO tunnel barriers and method of formation" (filed Apr. 14, 2004), supra, a method for forming MgO tunnel barriers is described which gives rise to MTJs which exhibit extraordinarily high values of tunneling magnetoresistance. To prevent the oxidation of a lower electrode formed from Fe, a method of forming the MgO barrier was developed in which a thin layer of metallic Mg was first deposited on top of the Fe layer and then a layer of MgO was deposited on top of this Mg layer through the reactive sputtering of Mg in an Ar—$O_2$ plasma. Using this method of preparing the MgO barrier, very high tunneling magnetoresistance values were obtained, much higher than any previously reported values for any MTJ at room temperature.

Figure 1B:
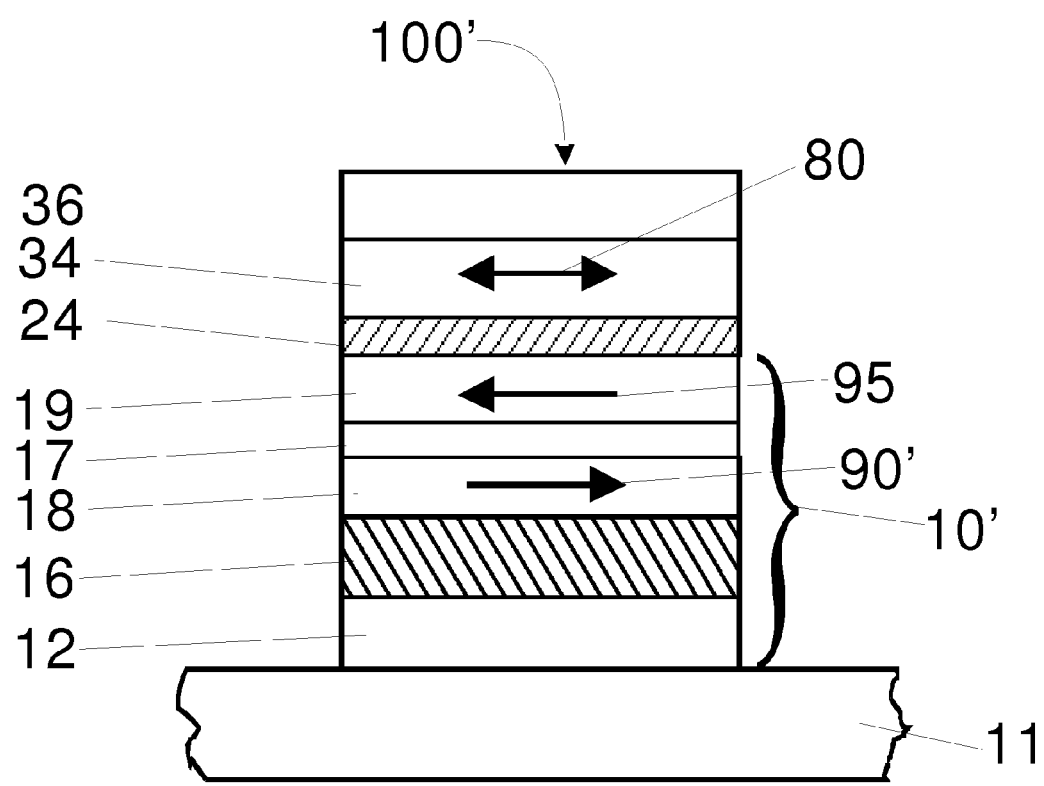
Figure 2A:
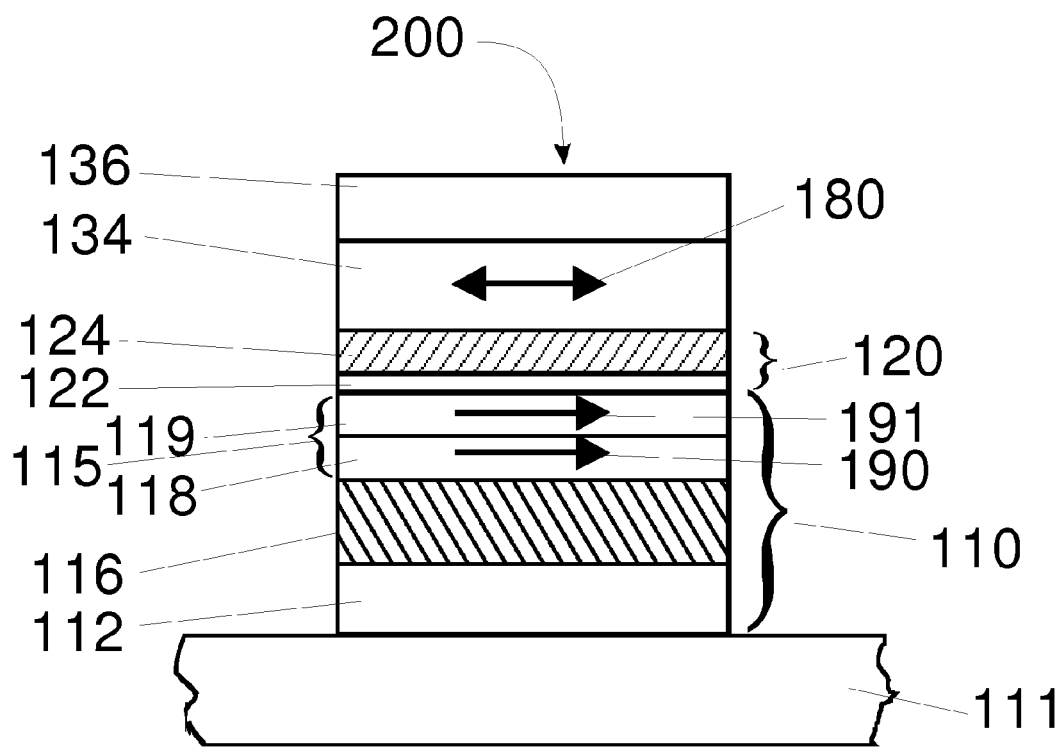
FIG. 2A illustrates the sequence of layers that are deposited to form a magnetic tunnel junction having high tunneling magnetoresistance (TMR).
Figure 2B:
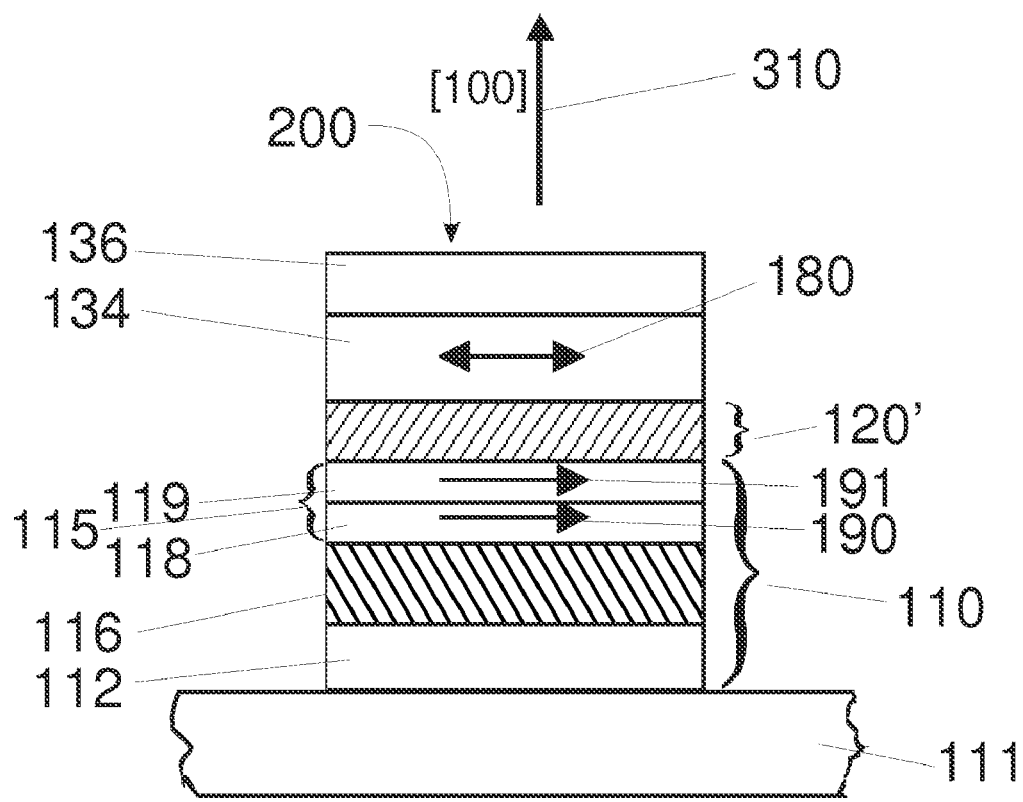
FIG. 2B is a cross sectional view of the magnetic tunnel junction that is formed according to the methodology of FIG. 2A.

FIG. 2A illustrates this process of forming a MTJ 200, in which a tunnel barrier 120 is formed by first depositing a thin Mg layer 122 followed by deposition by reactive sputtering of an MgO layer 124. As shown in FIG. 2B, it is more appropriate to view the MgO tunnel barrier as a single layer 120', since the layer 122 is oxidized to form MgO, with the layers 122 and 124 becoming largely indistinguishable as a result. For example, the layers 122 and 124 are not distinguishable in a cross-sectioned slice of the device examined in a transmission electron microscope. The thickness of the resulting MgO layer 120' is preferably in the range of 3-50 angstroms, more preferably 3-30 angstroms, still more preferably 3-20 angstroms, and most preferably 4-15 angstroms. FIG. 2A shows a device that includes a substrate 111, a bottom electrical lead 112, an antiferromagnetic layer 116, a fixed ferromagnetic (or ferrimagnetic) layer 118, a "free" ferromagnetic (or ferrimagnetic) layer 134, and a top electrical lead 136, all of which are similar to their FIG. 1B counterparts 11, 12, 16, 18, 34, and 36, respectively; these layers, as well as other layers and components referred to herein, may be constructed using techniques known to those skilled in the art. The arrows 180 and 190 illustrate possible orientations of the magnetic moments of the free ferromagnetic layer 134 and the fixed ferromagnetic layer 118, respectively. As shown in FIGS. 2A and 2B, the fixed ferromagnetic layer may actually be a bilayer 115 of two different ferromagnetic layers 118 and 119, each having a magnetic moment oriented as indicated by the arrows 190 and 191, respectively. The bilayer 115, the antiferromagnetic layer 116, and the bottom lead 112 of FIGS. 2A and 2B constitute a lower electrode 110.

MTJ structures formed according to the method described in U.S. patent application Ser. No. 10/824,835 to Parkin titled "MgO tunnel barriers and method of formation" (filed Apr. 14, 2004), supra, exhibit very high tunneling magnetoresistance values of more than 160% at room temperature. However, the high tunneling magnetoresistance is derived, not only from using a method of forming the MgO tunnel barrier which does not oxidize the lower ferromagnetic electrode, but also from forming a crystalline structure in which the ferromagnetic electrodes directly above and below the (100) textured MgO tunnel barrier have a bcc crystalline structure and are also textured in the (100) orientation. The layer 115 is preferably formed from a bcc alloy formed from one or more of Co and Fe. For example, layer 118 may be formed from Fe or $CO_{84}Fe_{16}$ and layer 119 may be formed from $CO_{70}Fe_{30}$. The crystallographic texture of these layers can be controlled by suitable choice of the underlayers. For example layer 112 may be formed from a bi-layer of TaN and Ta or from a layer of Ta alone. Layer 116 may be formed from an fcc antiferromagnetic alloy of Ir and Mn where the composition of Ir is less than ~30 atomic percent. The IrMn layer grows highly oriented in the (100) orientation when deposited on the layer 112 formed from Ta or TaN/Ta. The substrate 111 may be comprised of an amorphous material such as $SiO_2$. Using this combination of underlayers, the layer 115, comprised of one or more bcc Co—Fe alloys, is textured in the (100) orientation and the MTJ 200 displays high TMR.

A method of forming $Mg_{1-x}Zn_xO$ tunnel barriers is now described in connection with FIGS. 2A and 2B; $Mg_{1-x}Zn_xO$ tunnel barriers may be used instead of MgO tunnel barriers in the structures disclosed herein to form alternative embodiments. (See also U.S. application Ser. No. 10/734,425 to Parkin titled "Mg—Zn oxide tunnel barriers and method of formation" filed Dec. 12, 2003, which is hereby incorporated by reference.) The $Mg_{1-x}Zn_xO$ tunnel barriers are formed by i) first depositing, for example, a Mg—Zn layer without any oxygen (so that this Mg—Zn layer covers the underlying ferromagnetic or ferrimagnetic layer), and then by ii) depositing, for example, a layer of Mg—Zn in the presence of reactive oxygen during which process the previously deposited first Mg—Zn layer is oxidized, thereby forming the tunnel barrier.

The Mg—Zn composition of the metal layer 122 does not need to be the same as the Mg—Zn composition of the oxide layer 124. Indeed the layer 122 can be formed from pure Mg and the layer 124 can be formed from pure ZnO. Alternatively, the layer 122 can be formed from pure Mg and the layer 124 from $[Mg_{1-x}Zn_x]O$. Alternatively, the layer 122 can be formed from an alloy with a composition $[Mg_{1-y}Zn_y]$, whereas the layer 124 can be formed by the deposition of a layer of composition $[Mg_{1-z}Zn_z]$ in the presence of reactive oxygen. In general, to form a Mg—Zn oxide tunnel barrier according to preferred implementations of the invention herein, it is only necessary that one of the layers 122 and 124 include Mg and that the other of these layers include Zn.

The Zn concentration in the layer 122 can be higher or lower than that of the layer 124. The concentration of Zn in the layer 122 is preferably chosen to optimize the growth of the Mg—ZnO tunneling barrier 120' as well as for the target RA value. More Zn will lead to an oxide barrier with a reduced tunnel barrier height and so lower RA. Similarly, increasing the concentration of Zn in the oxide layer 124 will also lead to lower tunneling barrier heights and so to lower RA values. For the optimal tunnel barrier with the highest thermal stability, it may be preferable to form the layer 122 from an alloy of Mg—Zn with less Zn or even from pure Mg. It may also be preferable to form a tunnel barrier by first depositing a layer of Mg or a Mg—Zn alloy with small amounts of Zn, then by secondly depositing a layer of $[Mg_{1-x}Zn_x]$ in the presence of reactive oxygen (in which this layer contains a higher concentration of Zn), then by thirdly depositing a layer of Mg or $[Mg_{1-x}Zn_x]$ with lower concentrations of Zn in the presence of reactive oxygen. (In this case, Mg—Zn oxide tunnel barriers of two or more layers may be formed. These layers may be of the form $[Zn_{1-x}Mg_x]O$, in which the Mg atomic percentage is between 1 and 100, or between 1 and 99.) In general it may be advantageous to form the tunnel barrier 120' from a first layer of Zn or Mg or Mg—Zn, and then by depositing a sequence of Zn or Mg or Mg—Zn additional layers, in which each of the additional layers is formed in the presence of reactive oxygen. The amount of reactive oxygen may be varied from layer to layer. For example, it may be advantageous to have more oxygen for higher concentrations of Zn. It may also be preferable to have less reactive oxygen in the last additional layer onto which the ferromagnetic electrode 134 is subsequently deposited. The Mg—ZnO tunnel barrier 120' so formed may advantageously have a thickness of between 3 and 50 angstroms.

High tunneling magnetoresistance values have been found for a wide composition range of the ternary $[Mg_{1-x}Zn_x]O$ oxides, although the values are not typically as high as those found for oxides without any zinc. Typically, just as for MgO tunnel barriers, the TMR values were increased for thermal annealing at moderate temperatures, although the thermal stability was reduced compared to that of zinc-free MgO tunnel barriers. The thermal stability is very sensitive to the oxidation state of the $[Mg_{1-x}Zn_x]O$ layer, so that the properties of the MTJs are strongly dependent on the reactive sputtering conditions under which these oxide layers are formed, especially to the ratio of argon and oxygen in the sputter gas mixture.

The preferred embodiments and implementations of the invention are directed to certain magnetic layers and MgO or Mg—ZnO tunnel barrier layers which are substantially (100) oriented or textured. This is shown schematically in FIG. 2C, which shows the arrangement of atoms in a bcc structure oriented in the (100) direction with respect to the direction of tunneling of electrons. Layers 320, 321, 322 of atoms within an individual grain are shown for rows of atoms oriented along the [010] direction in-plane (indicated by the arrow 315) and [100] direction perpendicular to the plane (indicated by the arrow 310).

These magnetic and tunnel barrier layers are polycrystalline and are comprised of grains or crystallites which range in lateral extent from approximately one hundred to several hundred angstroms. Thus, these layers and the overall film structure are what is commonly referred to as textured. Texturing implies that there is a predominant crystallographic orientation of individual layers and/or the overall film structure, but that the grains are not perfectly aligned along one particular direction. Individual grains may not be precisely oriented with their (100) direction along the normal to the film layer. The (100) direction within individual grains (shown by the arrow 310 in FIGS. 2(b) and 2C may be oriented away from the normal to the plane of the film by an angle that can vary from a small fraction of one degree to several degrees or even tens of degrees for poorly textured films. The angular range of these (100) directions can be used to quantify the degree of (100) crystalline texture of the film structure and can be measured using various structural characterization techniques, including cross-section transmission electron microscopy and various x-ray diffraction techniques. There may also be present grains which are oriented in a completely different direction, but the proportion of these grains is small for the method of formation of the magnetic tunnel junction structures described herein.

Figure 2C:
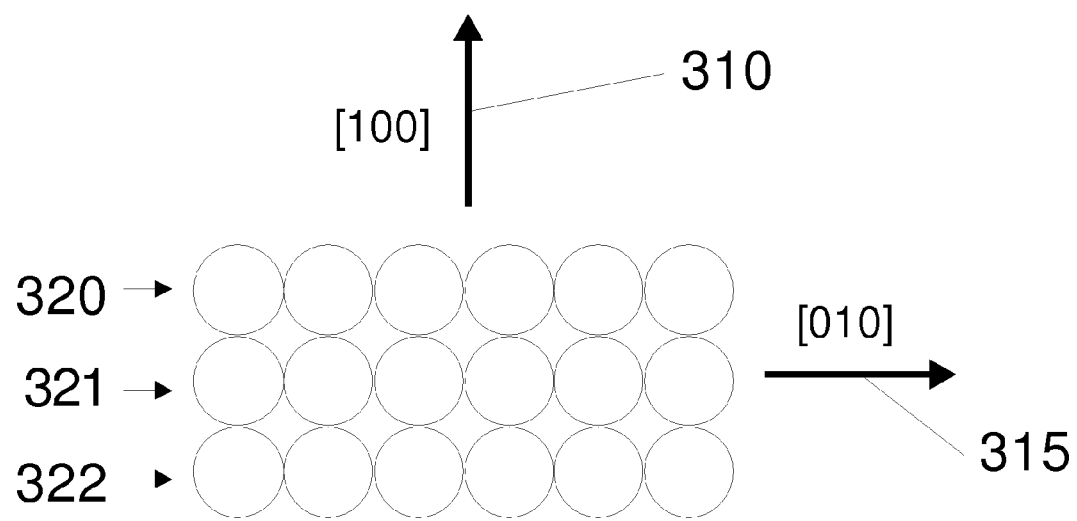
FIG. 2C is a schematic cross-section of the arrangement of the atoms in one of the layers of the textured magnetic tunnel junction formed according to the methodology of FIG. 2A.
Figure 2D:
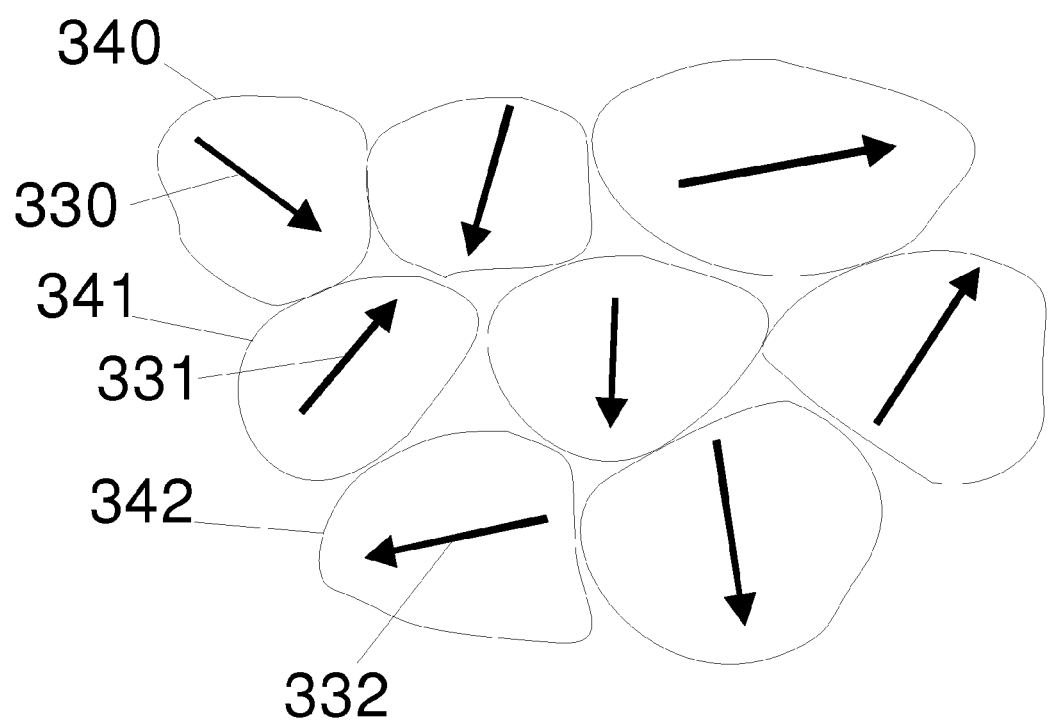
FIG. 2D is a schematic planar view of the magnetic tunnel junction formed according to the methodology of FIG. 2A showing the crystallographic orientation of crystalline grains within the polycrystalline structure.

The crystalline grains may be randomly oriented with respect to a direction within the plane of the substrate on which the film structures are grown, as shown in the schematic illustration in FIG. 2D. Various individual grains 340, 341 and 342 are shown within the plane of the film (looking down along the normal to the plane) of various shapes and sizes. The (010) direction (illustrated by the arrow 315 in FIG. 2C) within the grains 340, 341, 342 are indicated by the arrows 330, 331 and 332, respectively. The (010) direction may not lie exactly in the plane of the film but may be at an angle to this plane. It is the orientation or texturing of the film which is important with regard to the preferred embodiments herein. Whereas the maximum TMR is obtained for film structures which are highly textured, the TMR will be increased to the extent that the film structure is textured. It is preferred that the angular range of a (100) direction within the grains be within + or −20 degrees of the film normal, or more preferably within + or −10 degrees, and even more preferably within + or −5 degrees. As used herein, the term "(100) oriented" should be understood to include the aforementioned deviations from the ideal case, in which all the grains are precisely oriented with their (100) direction along the normal to the film layer.

Theoretical predictions of high TMR in MTJs formed from Fe/MgO/Fe were based on perfectly atomically ordered structures in which there was no disorder within the Fe and MgO layers and no disorder at the Fe/MgO interface. Even small amounts of disorder should, in principle, invalidate the conclusions of these simple-minded theoretical predictions, since the high TMR values are related to the spin-dependent tunneling of wave-functions of a particular symmetry from the Fe layer through the MgO tunnel barrier. Exotic techniques, such as molecular beam epitaxy and deposition at elevated temperatures on single crystalline substrates, are not useful for the mass-manufacturing of cheap devices for MRAM and other applications, particularly since manufactured devices are typically grown on template layers which are either amorphous or polycrystalline.

The structures and the associated methods of preparing them described herein are entirely compatible with mass manufacturing of these devices on a wide variety of templates which are not required to have any particular crystal structure or orientation. As illustrated in FIGS. 2C and 2D, the structures produced using the methods described herein are not expected to be single crystalline but rather highly textured polycrystalline films. Moreover, these films, since they are prepared at nominally room temperature (although these structures could be deposited at elevated temperatures, providing these temperatures do not result in significant interdiffusion of the layers or significantly increased roughness or other changes in the polycrystalline structure or morphology not consistent with the required structural elements for high TMR or spin polarization), are likely to contain significant atomic disorder. Even small amounts of disorder are likely to significantly reduce the TMR values predicted by theory, so it is very surprising that high TMR is observed in the devices and structures prepared using the methods described in the current invention.

A problem with the device illustrated in FIG. 2B is that the strong (100) crystallographic texture of the MgO layer will likely lead to significant variations in the orientation and strength of the magnetocrystalline anisotropy field from one device to the next. For prior art devices, where the crystallographic orientation of the MTJ device structure is not important, this may be mitigated by the use of ferromagnetic storage layers formed from materials that have no preferred crystallographic orientation. One class of such ferromagnetic materials are amorphous magnetic materials. For example, Co, Fe and CoFe ferromagnetic alloys, which are usually crystalline, can be made amorphous by diluting these materials with small amounts of glass forming elements. Glass forming elements are usually comprised of elements which have atomic sizes much larger or much smaller than that of the crystalline host material. Exemplary glass forming elements for Co, Fe and Co—Fe alloys are B, Si, Hf and Zr, although there are many others including the lanthanides and Y. One or more glass forming elements may be used. For example, CoFe may be combined with B and Hf.

Typically, the amount of glass forming elements required to make the host crystalline materials amorphous is in the range of 10 to 30 atomic percent. Larger quantities may be used to increase the crystallization temperature at which the alloy reverts to a crystalline form. MTJ memory storage devices, which have to be integrated with conventional microelectronic circuits to form an MRAM chip, may be subjected to high temperatures. For example, if the MTJ elements are integrated in the back end of line, they may be subjected to temperatures up to 400° C. or higher for several hours. Adding larger amounts of the glass forming element typically increases the crystallization temperature, but at the same time these elements may reduce the magnetic ordering temperature of the ferromagnetic alloy.

With reference to FIG. 2D, alloying typical 3d transition metal ferromagnetic alloys (those comprised of one or more of Co, Fe and Ni) with typical glass forming elements (e.g., B) causes the crystalline structure to be eliminated or results in the size of the crystalline grains being very small. With reference to FIG. 2C, the ordered arrangement of the atoms within the ferromagnetic material is also destroyed even on an atomic scale. Thus there is no longer any crystallographic orientation along which the magnetic moments prefer to align, so the magnetic switching characteristics of such devices are much more uniform than crystalline devices. However, as taught in U.S. patent application Ser. No. 10/824, 835 to Parkin, supra, an important requirement for high TMR MTJs is that the MgO tunnel barrier be crystalline and preferably textured in the (100) orientation. This requirement would appear to preclude the use of amorphous ferromagnetic materials in such MTJs.

Figure 3A:
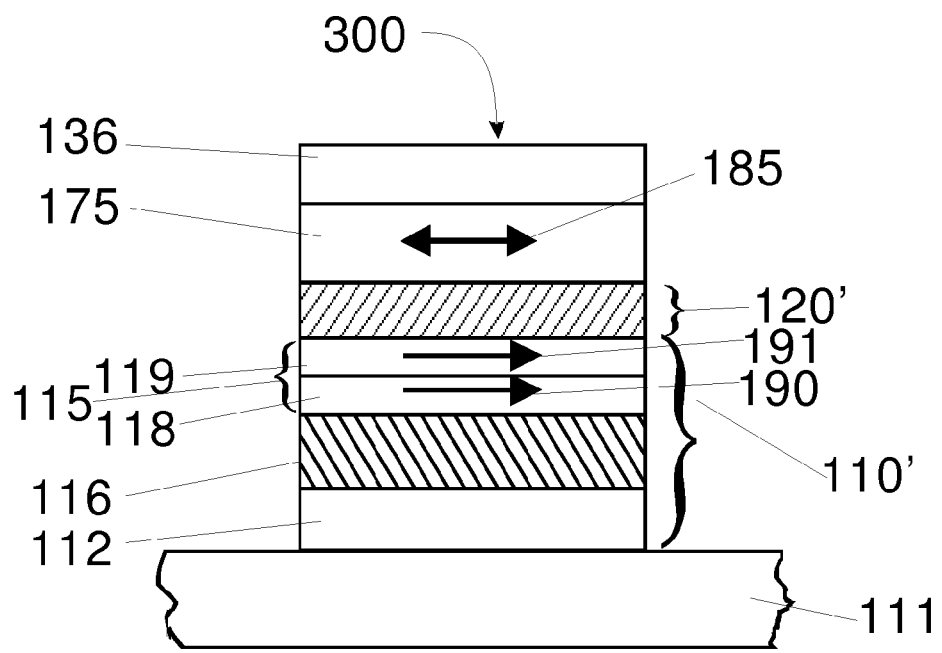
FIGS. 3A and 3B are cross-sectional views of magnetic tunnel junctions of the present invention.

FIG. 3A shows a device which uses a free layer formed from an amorphous alloy of CoFeB but which nevertheless shows high tunneling magnetoresistance of more than 130%, as discussed in U.S. patent application Ser. No. 10/884,831 to Parkin filed Jul. 2, 2004 and titled "High performance magnetic tunnel barriers with amorphous materials", which is hereby incorporated herein by reference. The structures and the method of forming preferred structures are now described. The MTJ device shown in FIG. 3A has an exchange biased reference electrode 110' formed beneath the MgO tunnel barrier. The magnetic state of the reference electrode remains unchanged during the operation of the device. An antiferromagnetic layer 116 is used to set the direction of the moment of the ferromagnetic layer 115 by exchange bias. The direction of the exchange bias field is set either during the fabrication of the MTJ device or by heating the device above the blocking temperature of the antiferromagnetic layer and cooling the device in the presence of a magnetic field, sufficiently large to align the moment of the layer 115 along a given direction. The antiferromagnetic layer is preferred but the device may be built without the layer 116. The direction of the reference electrode 115 is then maintained during the operation of the device by providing a uniaxial anisotropy field. This may be provided by the intrinsic magneto-crystalline anisotropy of the layer 115 or may be provided by the shape anisotropy of the reference electrode or by other means.

In FIG. 3A the direction of the magnetization of the storage layer 175, located above the tunnel barrier 120', is maintained either parallel or antiparallel to that of the layer 115 (on the other side of the tunnel barrier) during the operation of the device. The MTJ device of FIG. 3A may also be inverted, such that the reference ferromagnetic electrode is formed above the tunnel barrier and the storage layer is formed beneath the tunnel barrier.

In FIG. 3A, the substrate 111 is formed from an amorphous layer of $SiO_2$ formed on a silicon substrate. The underlayer or bottom electrical lead 112 is comprised of 100 Å Ta. An antiferromagnetic layer 116 of IrMn 150 Å thick is deposited on the Ta layer by ion beam sputter deposition using a beam of energetic krypton ions from an rf plasma ion source. The sputtering target used to form the IrMn layer has a composition of $Ir_{22}Mn_{78}$. Next, a ferromagnetic layer 115 of 35 Å $Co_{70}Fe_{30}$ is deposited. The layer 115 may be formed from one or more ferromagnetic layers 118 and 119.

An MgO tunnel barrier 120' is then formed on top of the lower ferromagnetic electrode 110' using the method described in U.S. patent application Ser. No. 10/824,835 to Parkin titled "MgO tunnel barriers and method of formation" (filed Apr. 14, 2004), supra, by first depositing a thin layer of Mg having a thickness in the range of 3 to 20 Å, followed in a second step by the deposition of a layer of Mg in the presence of reactive oxygen. The thickness of the second layer, which is comprised of MgO, is typically in the range from 2 to 30 Å depending on the desired resistance-area product, which can range up to more than $10^9 \Omega(\mu m)^2$. For the device of FIG. 3A, a Mg layer 6 Å thick was used, followed by an MgO layer 22 Å thick formed by reactive magnetron sputtering using an argon-oxygen plasma containing 3 atomic percent oxygen. During the deposition of the MgO layer, the Mg underlayer becomes oxidized so that the two layers form a single MgO tunnel barrier. The exact composition of the MgO layer may differ from the stoichiometric composition.

Next, the MTJ device shown in FIG. 3A is completed by forming the top ferromagnetic electrode which is the storage layer. The storage layer is comprised of an amorphous ferromagnetic layer 175. For example, the layer 175 may be comprised of 75 Å thick $(Co_{73}Fe_{27})_{74}B_{26}$. This layer is formed by magnetron sputtering in a pure argon plasma where a target of composition $(Co_{70}Fe_{30})_{80}B_{20}$ is used. The composition of the film and that of the target may be significantly different, especially when the target is comprised of elements which are significantly different in atomic mass or which have significantly different sputter yields. The composition of the film was checked with Rutherford back scattering (RBS) on companion films made in the same deposition sequence which were ~1000 Å thick.

Finally, the device 300 of FIG. 3A is completed by forming a capping layer 136 which is comprised of 100 Å TaN followed by 75 Å Ru. The TaN layer is formed by reactive magnetron sputtering using an argon-nitrogen plasma containing about 8% nitrogen. The Ru layer is formed by ion beam sputtering.

Figure 4:
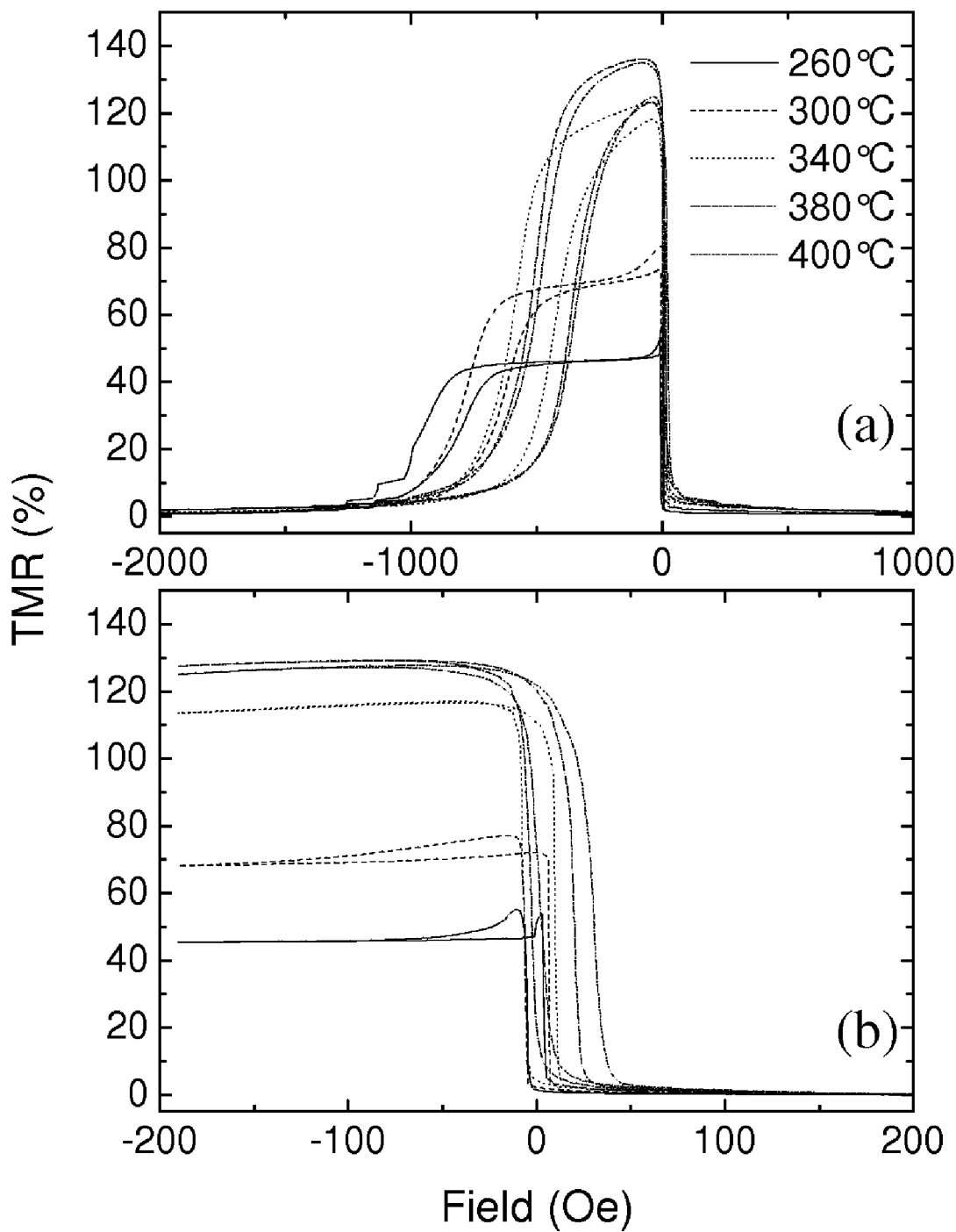
FIG. 4, which includes
Figure 5:
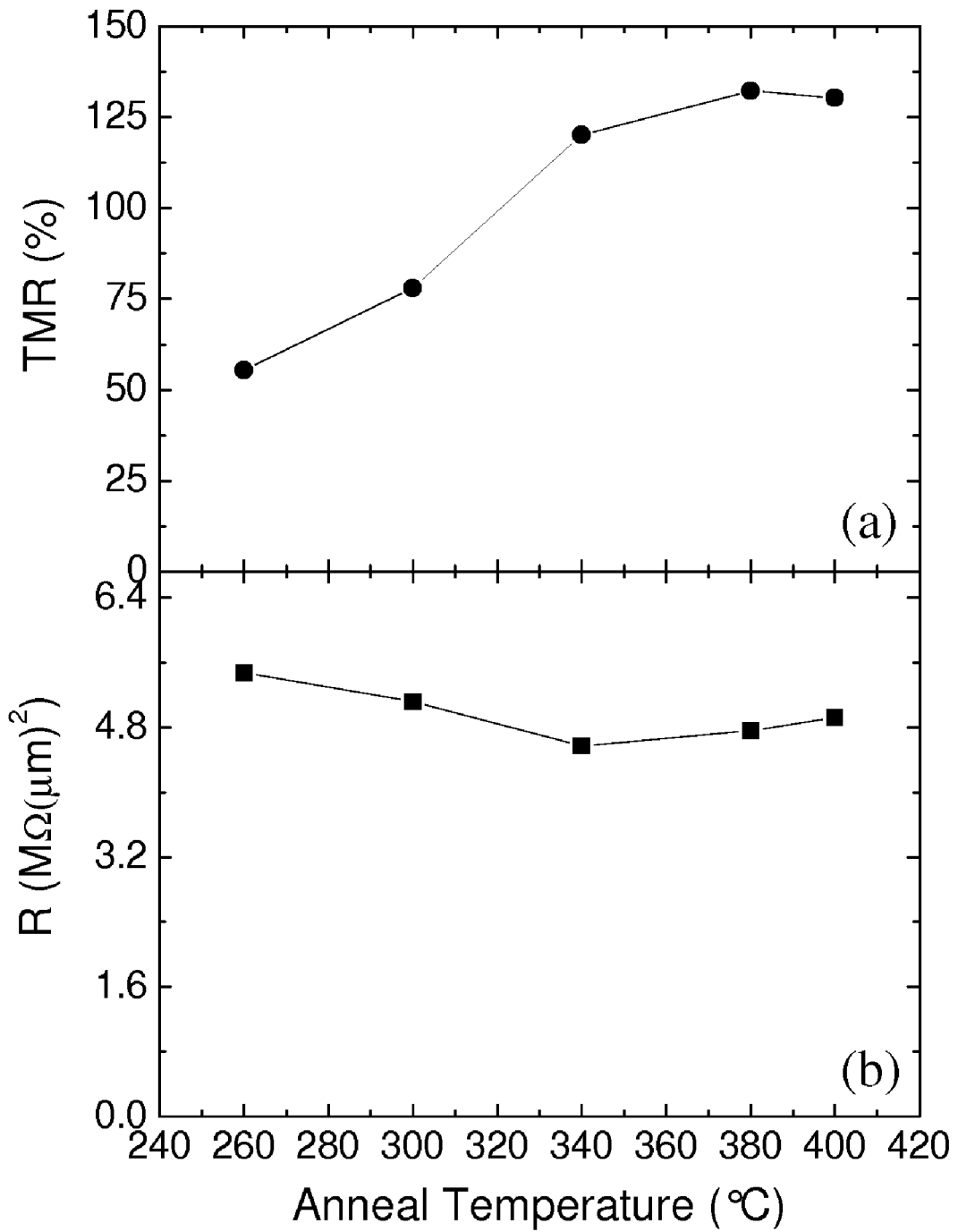
FIG. 5, which includes

Resistance versus field curves for the completed device of FIG. 3A are shown in FIG. 4. Several curves are shown corresponding to the properties measured on the same device at room temperature after the device has been subjected to a series of thermal anneals in a high vacuum anneal furnace at a series of increasing temperatures of 260, 300, 340, 380 and 400° C. The device is maintained at each of these temperatures for 90 minutes and is then cooled to room temperature in vacuum. Anneal times can be varied from a few minutes to a few hours depending on the temperature. The higher the temperature, the shorter the anneal required. Rapid thermal annealing is also possible which involves heating the device for the shortest possible time but at higher temperatures. During the anneal treatment the device is maintained in a magnetic field (1000 Oe) in the plane of the device. The direction of the magnetic field determines the direction of the exchange bias field provided by the IrMn antiferromagnetic layer. As can be seen from FIG. 4, the magnitude of the exchange bias field decreases with increasing anneal temperature but, even after the final anneal at 400° C., is ~500 Oe. The magnitude of the tunneling magnetoresistance increases with anneal temperature, as shown in more detail in FIG. 5, and reaches a value of nearly 140% after an anneal at 380° C. The TMR is only slightly reduced after an anneal at 400° C. Also shown in FIG. 5 is the resistance of the device in the low resistance state of the MTJ device (when the magnetic moments 190, 191 of the reference layer 115 are parallel to the magnetic moment 185 of the storage layer 175). The resistance of the device (shown as the resistance-area product, RA) hardly changes at all on annealing to temperatures as high as 400° C.

Figure 6:
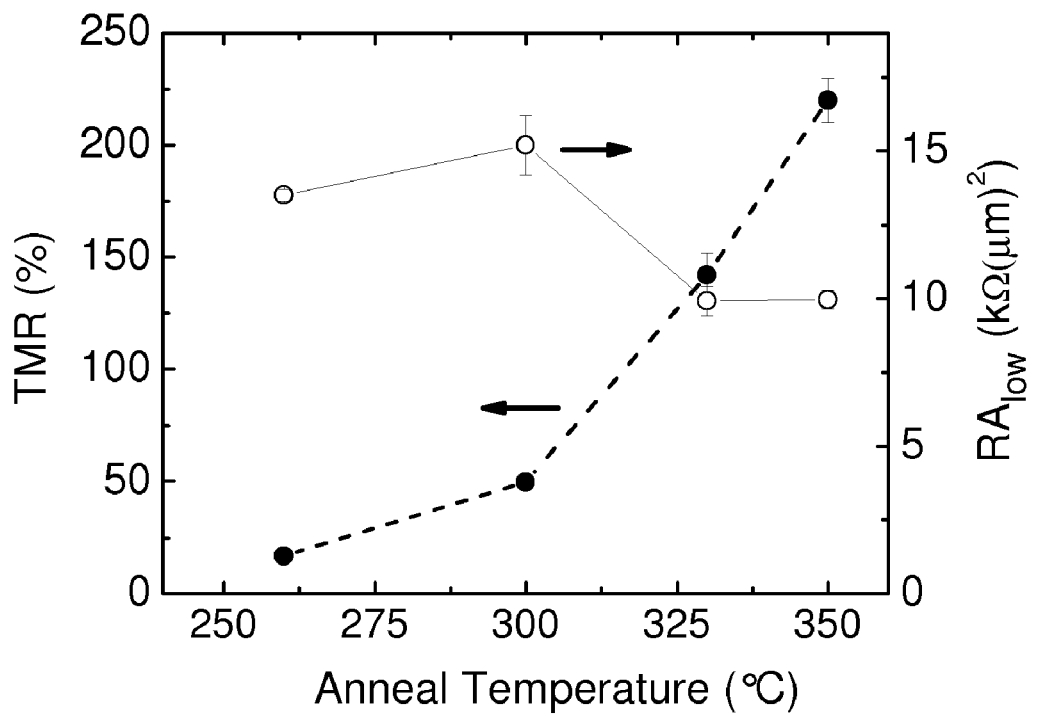
FIG. 6 shows the dependence of tunneling magnetoresistance (left hand axis) and the resistance-area product (right hand axis) as a function of anneal temperature for an MTJ of the present invention.

The resistance of the device corresponding to FIG. 4 is high (RA ~5 $M\Omega(\mu m)^2$) because the device is formed by shadow masking and has an area of ~80×80 $(\mu m)^2$. Similar MTJ structures with much lower RA values were deposited at the same time at that of FIG. 4 and measured using the technique of CIPT (Current-in-plane-tunneling) as discussed in the paper by D. C. Worledge and P. L. Trouilloud, Appl. Phys. Lett. 83, 84 (2003). Results are shown in FIG. 6 for a device which has a RA value of ~10 $k\Omega(\mu m)^2$. This is a useful RA value for MRAM MTJ devices at the 180 nm technology node. The MTJ structure was formed in the same way as that of the device of FIG. 4, but the MgO barrier 120' was formed by first depositing a wedge of Mg across a 1" diameter silicon wafer where the thickness of the Mg layer varied from ~2 to ~12 Å. Then a layer of 8 Å MgO was deposited by reactive magnetron sputtering. CIPT measurements of the resistance-area product and TMR were made at various positions along the wedge. The resistance along the Mg wedge varied from ~800 to ~10,000 $\Omega(\mu m)^2$, but high TMR values exceeding 100% were recorded at all positions along the wedge after an anneal treatment at 350° C. At one end of the wedge where the RA was ~10,000 $\Omega(\mu m)^2$, TMR values of more than 220% were found after an anneal treatment at 350° C. The TMR of these devices was found to increase substantially on annealing as shown in FIG. 5.

Thus, very high TMR values are unexpectedly found for MTJs with highly textured (100) MgO tunnel barriers but with nominally amorphous storage layers. Cross-section transmission electron microscopy reveals that a portion of the storage layer 175 adjacent to the MgO tunnel barrier 120' has crystallized and is, moreover, textured in the same orientation as the crystalline MgO tunnel barrier. The simple cubic crystalline MgO layer thus provides a template for the formation of a thin crystalline ferromagnetic layer which has the bcc structure of CoFe and is oriented in the same (100) direction as the MgO layer. Nevertheless the bulk of the storage layer 175 remains amorphous, providing considerable improvement in the magnetic switching properties of arrays of MTJ devices.

The TMR of the device of FIG. 3A is nearly two times higher than the highest TMR ever reported in prior art devices using conventional alumina tunnel barriers. Moreover, the TMR of the device 300 is very similar to devices formed using storage layers comprised of crystalline CoFe alloys as described in U.S. patent application Ser. No. 10/824,835 to Parkin titled "MgO tunnel barriers and method of formation" (filed Apr. 14, 2004) and Ser. No. 10/646,246 to Parkin titled "MgO tunnel barriers and method of formation" (filed Aug. 22, 2003), which are hereby incorporated by reference. This surprising and unexpected result is likely due to the formation of a very thin crystalline ferromagnetic interface layer (which is not shown in FIG. 3A) at the boundary between the MgO tunnel barrier 120' and the layer 175. Since the phenomenon of spin-dependent tunneling is very sensitive and largely determined by the magnetic and electronic properties of the interface layers at the upper and lower faces of the tunnel barrier, only a very thin crystalline interface layer would need to be formed, perhaps by crystallization of the interface layer of the CoFeB layer 175 on the underlying MgO crystalline layer 120'. The highly (100) textured MgO layer is likely to form an excellent template layer for the formation of a thin crystalline layer of CoFeB. It could also be that the B diffuses away from the interface with the MgO layer, during the thermal anneal treatments, to leave a thin interface layer at this interface which is much lower in B content. Electron energy loss spectroscopy in a high resolution scanning transmission electron microscope on related MTJ devices suggests this latter unexpected possibility. A lowered boron content is likely to aid the formation of a thin crystalline CoFe interface layer.

Figure 3B:
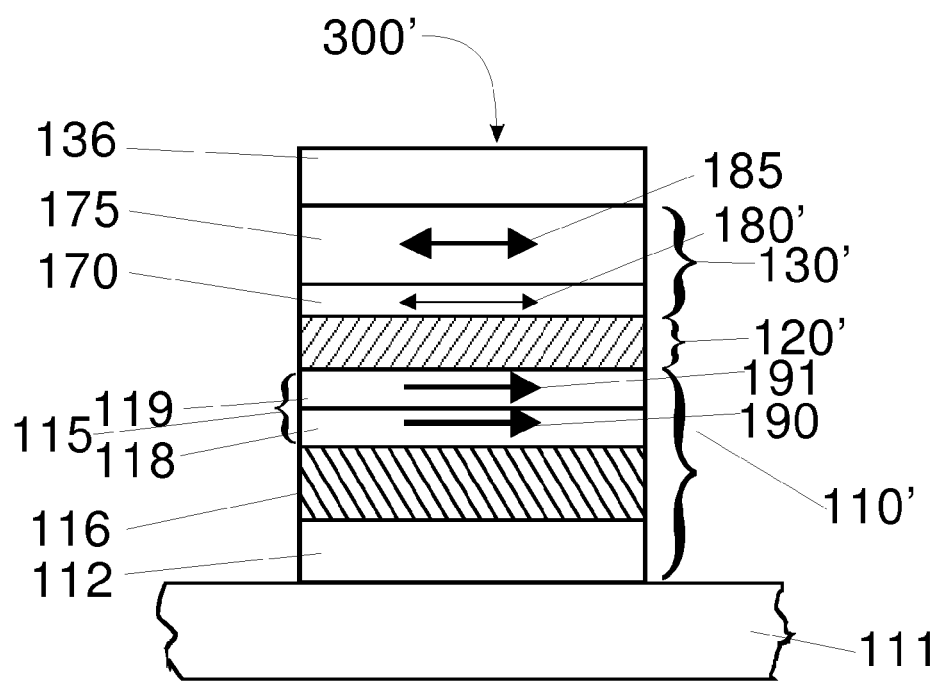

FIG. 3B shows an alternate embodiment. FIG. 3B shows a device 300' in which a thin interface layer 170 comprised of a crystalline CoFe alloy is first formed on the MgO tunnel barrier prior to the deposition of the amorphous ferromagnetic layer 175. Thus the storage layer may be formed from a bilayer of two ferromagnetic layers, a first crystalline ferromagnetic layer 170 and a second amorphous ferromagnetic layer 175. These layers may also be formed from ferrimagnetic layers, crystalline and amorphous in nature, respectively. In FIG. 3B the layer 170 is formed from 20 Å thick $CO_{70}Fe_{30}$, which may be deposited by magnetron or ion beam sputter deposition. High tunneling magnetoresistance values are found with such structures exceeding 120%. The thickness of the CoFe interface layer can range preferably from 2.5 to 30 Å. The thickness of this layer is preferably kept as small as possible so that the magnetic properties of the storage layer 130' are dominated by that of the amorphous layer 175.

The two ferromagnetic layers 170 and 175 are strongly exchange coupled one to the other and so behave as a single magnetic moment. The orientation of the magnetic moment of the layer 170 is indicated by the double headed arrow 180' and that of the layer 175 by the arrow 185, but the moments of the two layers are always parallel to one another for sufficiently thin ferromagnetic layers.

It is to be understood that the use of the term amorphous as used to describe one of the ferromagnetic layers in the MTJ device refers to the nominal structure that this alloy composition would exhibit if deposited on an amorphous substrate at room temperature.

Figure 7:
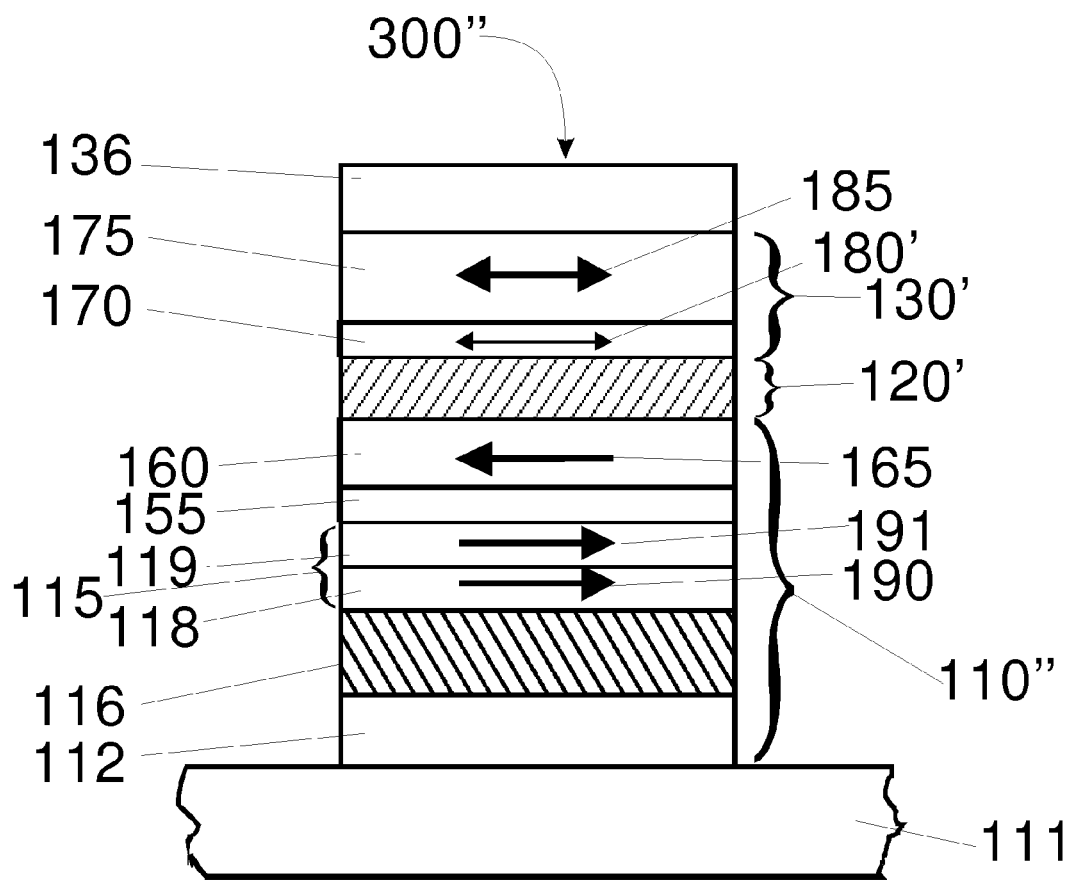
FIG. 7 shows a cross-sectional view of a magnetic tunnel junction of the present invention.

FIG. 7 shows another embodiment, a device 300" in which a reference layer 110" is formed from an antiparallel sandwich of two thin ferromagnetic layers 115, 160 separated by an antiferromagnetic coupling layer 155 formed from a bcc alloy of $Cr_{70}Mo_{30}$. The storage layer 130' is formed either from an amorphous ferromagnetic alloy layer 175 as shown in FIG. 3A or from a bilayer comprising a thin crystalline ferromagnetic layer 170 and an amorphous ferromagnetic layer 175 as shown in FIG. 3B. The underlayer or bottom electrical lead 112 is comprised of a 200 Å bilayer of TaN and Ta. TaN is formed by reactive magnetron sputtering from a Ta target in an Ar—$N_2$ gas mixture containing ~6% nitrogen. The nitrogen content in the gas mixture is preferably chosen to give a slightly nitrogen deficient TaN layer which gives rise to an improved texturing of the overlying Ta layer and IrMn layer 116. The Ta layer of the underlayer 112 may be 75 Å Ta sputter deposited using the same Ta target but using pure argon sputtering gas. An antiferromagnetic layer 116 of IrMn 250 Å thick is deposited on the Ta layer by ion beam sputter deposition using a beam of energetic krypton ions from an rf plasma ion source. Next a ferromagnetic layer 115 of 35 Å $CO_{70}Fe_{30}$ is deposited. The layer 115 may be formed from one or more ferromagnetic layers 118 and 119.

An antiferromagnetic coupling layer 155 formed from 17.5 Å $Cr_{80}Mo_{20}$ is deposited on top of layer 115. The lower ferromagnetic electrode 110" is completed with the layer 160 (whose magnetic orientation is given by the arrow 165), which is formed from 25 Å $CO_{70}Fe_{30}$. The layers 160 and 115 are antiferromagnetically coupled by indirect exchange coupling through the metallic CrMo layer 155.

Finally, the MTJ device shown in FIG. 7 is completed by forming the top ferromagnetic electrode 130' which is the storage layer. The storage layer is formed from a bilayer of two ferromagnetic layers. First a crystalline layer 170 comprised of 20 Å $CO_{70}Fe_{30}$ is deposited by magnetron sputter deposition followed by a layer 175 which is comprised of a Co—Fe—B alloy, specifically, $(CO_{70}Fe_{30})_{80}B_{20}$ which is 120 Å thick. The layer 175 is also deposited by magnetron sputter deposition from a single sputter target. Layer 175 is nominally amorphous in nature.

The storage layer 130' is capped with a layer 136 which is here comprised of 100 Å TaN followed by 75 Å Ru. The TaN is formed by reactive sputtering of Ta in an Ar—$N_2$ gas mixture where the $N_2$ composition is chosen so that the TaN is fully nitrided. A gas mixture with 10% $N_2$ was used here.

Figure 8:
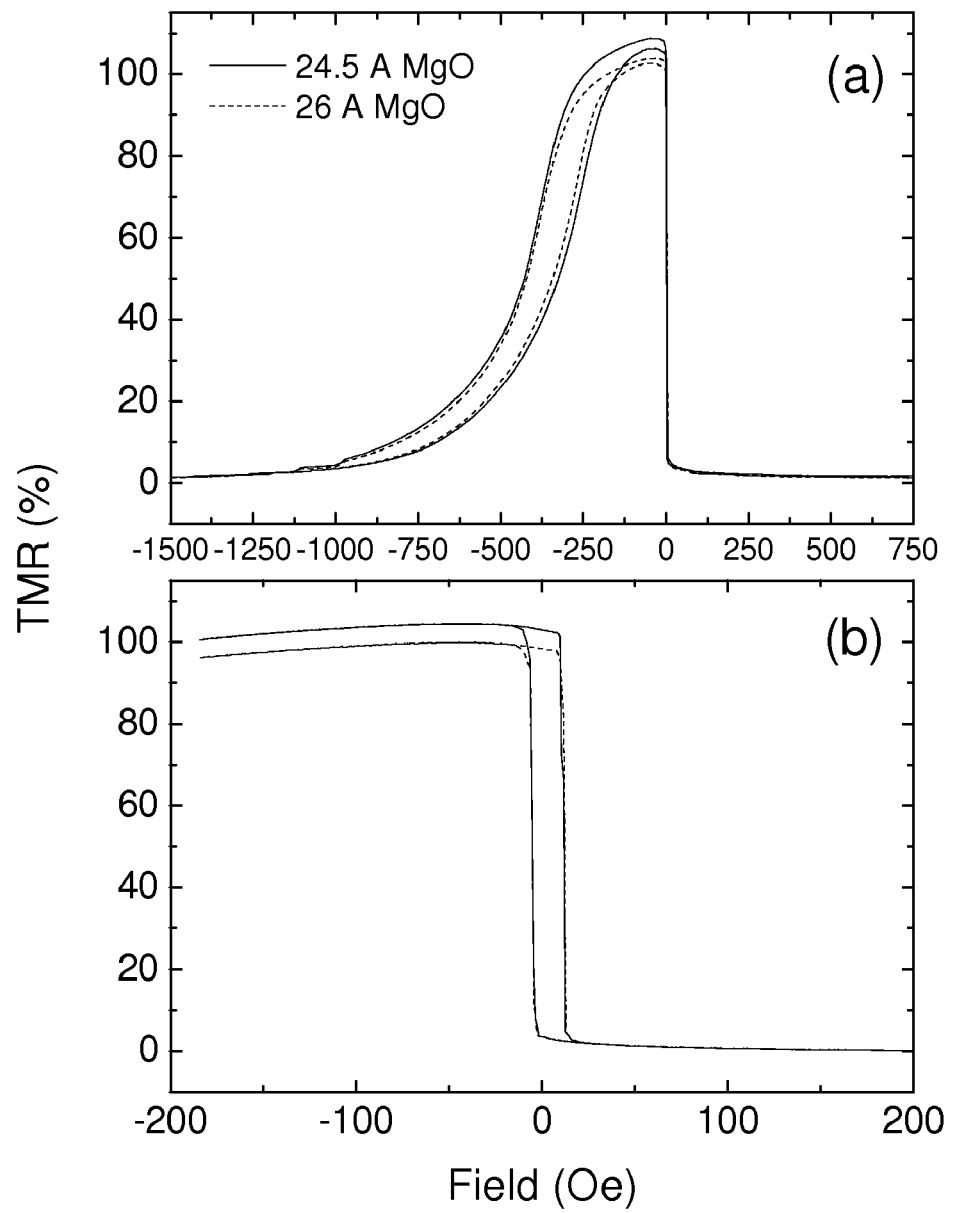
FIG. 8, which includes

Typical resistance-versus-field curves for the structure shown in FIG. 7 are presented in FIG. 8. The data in FIG. 8A show a TMR exceeding 100% which is far higher than has previously been observed for MgO-based MTJs with a synthetic antiferromagnet reference layer. The exchange bias of the IrMn antiferromagnetic exchange bias layer was set by annealing the samples at 260° C. for 90 minutes in a high vacuum anneal furnace in the presence of a magnetic field of 1 Tesla. The MgO tunnel barrier corresponding to the data in FIG. 8 was formed by first depositing a Mg layer 6 Å thick followed by the reactive magnetron sputter deposition of an MgO layer 24.5 and 26 Å thick, respectively for the two sets of data.

The structure shown in FIG. 7 has both an improved synthetic antiferromagnet reference layer and an improved storage layer suitable for high TMR magnetic tunnel junctions. The combination of the highly magnetically stable reference layer, which is a suitable underlayer for the growth of a (100) oriented MgO or $Mg_{1-x}Zn_xO$ tunnel barrier required for very high TMR, and a storage layer, which is formed from an amorphous ferromagnetic alloy or a bilayer comprised of an amorphous ferromagnetic layer with a thin crystalline interface layer, give MTJ devices with improved magnetic switching characteristics. The uniformity of the magnetic switching fields of an array of MTJ memory devices can be characterized by an array quality factor (AQF) where this factor is defined as the ratio of the magnitude of the average magnetic switching field for the devices within the array to the standard deviation of the distribution of switching fields, assuming a Gaussian distribution of switching fields. Large AQF factors are needed to make operable a cross-point MTJ based MRAM chip when the devices are switched by applying a combination of a write-line and a bit-line writing field. The AQF factors are significantly increased for MgO based MTJ devices when the storage layer of the present invention is used in combination with the improved synthetic antiferromagnetic layer shown in FIG. 7.

Figure 9:
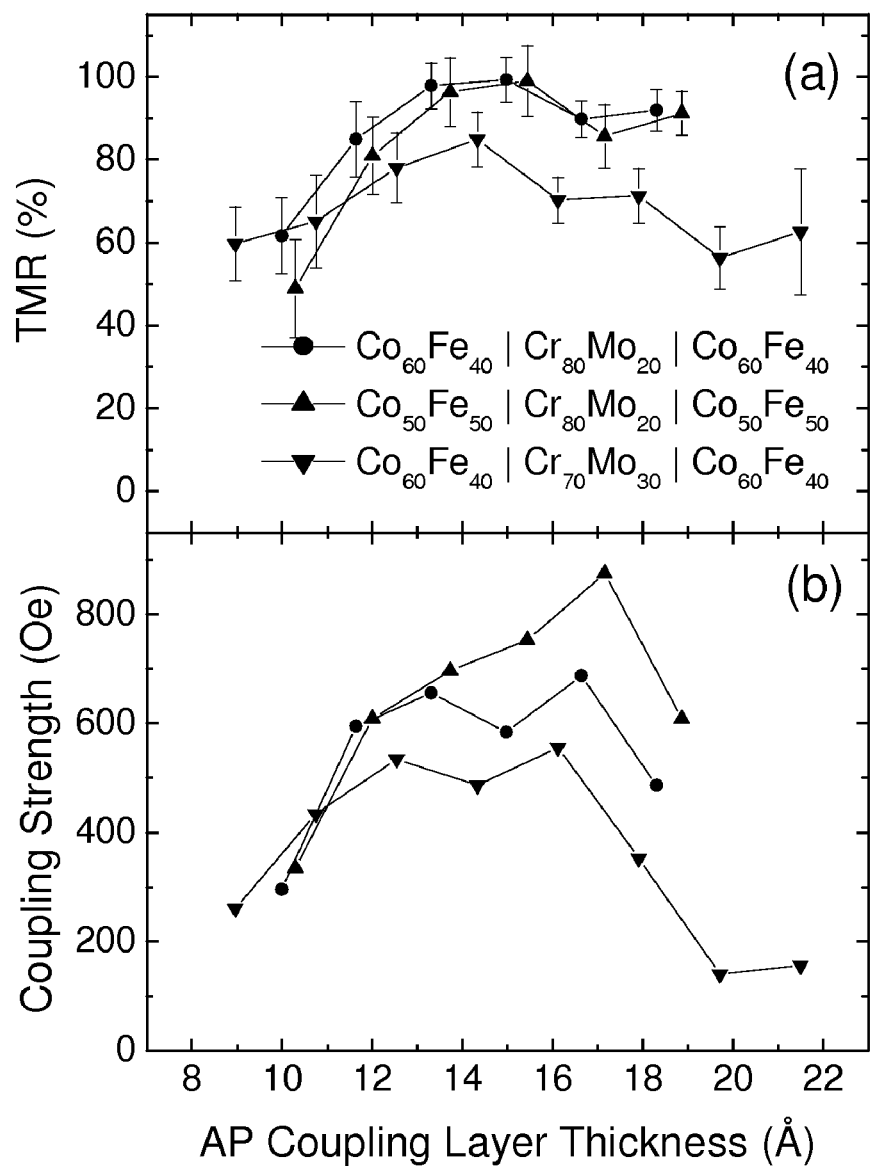
FIG. 9, which includes

FIG. 9 shows the dependence of (a) the tunneling magnetoresistance and (b) the antiferromagnetic coupling field for various MTJs of the present invention with two different Co—Fe alloy reference layer compositions as a function of thickness of the Cr—Mo antiferromagnetic coupling layer for two different Cr—Mo compositions. The detailed structure of the MTJs was 200 Å TaN|75 Å|Ta 250 Å IrMn|25 Å $CO_{60}Fe_{40}$ or $CO_{50}Fe_{50}$|xÅ CrMo|25 Å $CO_{60}Fe_{40}$ or $CO_{50}Fe_{50}$|MgO|20 Å $CO_{60}Fe_{40}$ or $CO_{50}Fe_{50}$|120 Å $(CO_{70}Fe_{30})_{80}B_{20}$|100 Å TaN|75 Å Ru|. The MgO was formed using the two step process described earlier. The samples were annealed at 260° C. for 90 minutes in high vacuum and in a field of 1 Tesla to set the IrMn exchange bias.

The TMR was found to depend strongly on the composition of the Co—Fe reference ferromagnetic layers 115 and 160 with higher Fe content yielding higher TMR. The highest TMR values were found for $Co_{100-x}Fe_x$ layers with x~50-60 (i.e., 50-60 atomic %). Similar results were found for $CO_{60}Fe_{40}$ and $CO_{50}Fe_{50}$. The data shown in FIG. 9A are averaged over 10 junctions formed on one wafer where the junctions have areas of ~100×100 $(\mu m)^2$ and are formed by a series of shadow masks placed successively on the silicon substrate without breaking vacuum under computer control.

Antiferromagnetic coupling layers formed from Cr—Mo alloys gave improved TMR compared to layers formed from pure Cr. The likely explanation is that the polycrystalline (100) texture is greater or is improved for Cr—Mo spacer layers compared to pure Cr. On the other hand if too much Mo is added to the alloy, the strength of the antiferromagnetic coupling will be greatly diminished. As originally discovered by Parkin (see Phys. Rev. Lett. 67, 3598 (1991) and 64, 2304 (1990)), there is a systematic variation of the overall strength of the oscillatory interlayer exchange coupling in both Cr and Ru spacer layers, such that the coupling strength increases along the 3d, 4d and 5d transition metal periods and is systematically greater for 3d compared to 4d compared to 5d elements from the same column in the Periodic Table. Thus the coupling strength through Mo is much weaker than through Cr. The preferred range of composition of Mo in Cr—Mo alloys is ~10 to 50 atomic % Mo. Moreover, as more Mo is added the oscillation period is decreased making the strength of the antiferromagnetic coupling more sensitive to the thickness of the spacer layer. It is preferred to use an alloy composition with the largest possible period of oscillation of the oscillatory interlayer coupling so that the strength of the antiferromagnetic coupling is not strongly dependent on the spacer layer thickness. This provides a greater window of manufacturability.

The data shown in FIG. 9 are given for CrMo thicknesses of the CrMo layer 155 for which the layers 115 and 160 are antiferromagnetically coupled. The indirect magnetic exchange coupling between two ferromagnetic layers mediated by Cr oscillates between ferromagnetic and antiferromagnetic coupling as the thickness of the Cr spacer layer is increased (see "Oscillations in Exchange Coupling and Magnetoresistance in Metallic Superlattice Structures: Co/Ru, Co/Cr and Fe/Cr", Phys. Rev. Lett. 64, 2304 (1990)). Similarly, for Cr—Mo alloys the coupling also oscillates between ferromagnetic coupling and antiferromagnetic coupling. For the range of CrMo thickness shown in FIG. 9, the coupling is antiferromagnetic but the strength of the coupling varies with the thickness of the CrMo layer and is largest for CrMo thicknesses in the range of 14-16 Å. However, there is a broad range of CrMo thickness for which the coupling is antiferromagnetic which makes the use of CrMo attractive. For example, for an antiferromagnetic coupling layer formed from $Cr_{70}Mo_{30}$, antiferromagnetic coupling is found for thicknesses ranging from ~10 to 20 Å, although the largest magnitude of the coupling is found for thicknesses in the middle of this range. The exact range of thicknesses varies with the Cr—Mo alloy composition but is readily determined by forming a series of MTJ structures in which the thickness of this spacer layer is varied and the magnitude of the coupling strength determined by measuring the field required to bring the moments of the ferromagnetic layers on either side of the spacer layer parallel to one another.

Figure 10:
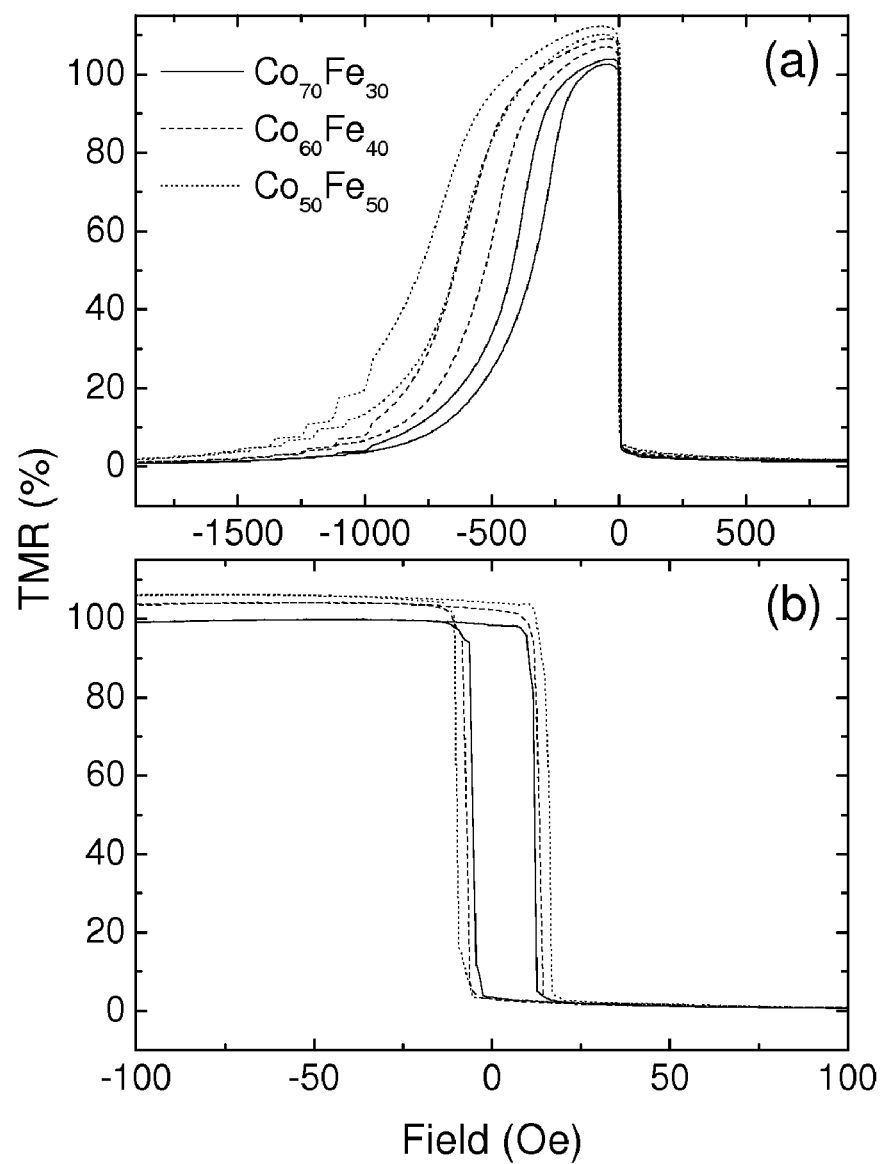
FIG. 10, which includes FIGS. 10A and 10B, compares tunneling magnetoresistance versus field loops for MTJs of the present invention with ferromagnetic layers formed from three different CoFe compositions and antiferromagnetic coupling layers formed from $Cr_{80}Mo_{20}$.

FIG. 10 compares resistance versus field loops for MTJs (for the same structures used to collect the data of FIG. 9) with ferromagnetic layers formed from three different CoFe compositions (used for layers 115, 160, and 170) and antiferromagnetic coupling layers formed from $Cr_{80}Mo_{20}$. Major and minor loops are shown in FIGS. 10A and 10B, respectively. The layer 175 was formed from $(CO_{70}Fe_{30})_{80}B_{20}$. The TMR is similar for three different CoFe compositions with 30, 40 and 50 atomic % Fe. The coercivity of the storage layer also varies little with CoFe composition for these large area junctions.

Figure 11:
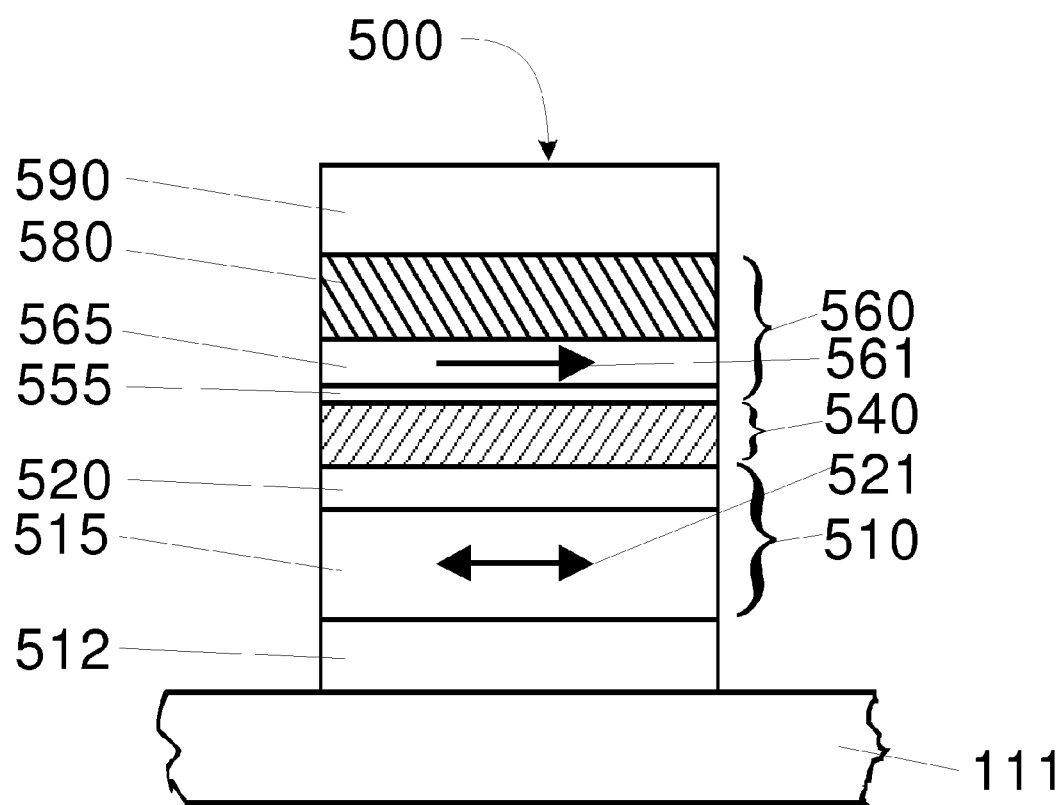
FIG. 11 shows a cross-sectional view of a magnetic tunnel junction of the present invention.

FIG. 11 shows another representative embodiment in which the structure of the devices shown in FIGS. 3A and 3B is inverted so that the storage layer or electrode is formed beneath the tunnel barrier and the reference electrode is formed above the tunnel barrier. The structure is formed on a substrate 111 such as an amorphous layer of $SiO_2$ on a silicon substrate. An underlayer 512 is then deposited on the wafer 111. To form this layer 512, first a layer of MgO is formed by reactive sputtering of Mg in an argon-oxygen plasma containing 3 percent oxygen. Then a Ta layer, 100 Å thick is deposited by magnetron sputtering in pure argon. The structure of the Ta layer is very sensitive to the deposition parameters including the rate of deposition of the Ta layer (power applied to the magnetron source). Alternate combinations of materials for the underlayer may be used. The Ta layer may be used without the MgO underlayer. The underlayer 512 ideally provides a smooth surface on which a storage electrode 510 is subsequently formed. The underlayer 512 is preferably chemically inert and unreactive with the electrode 510 and also sufficiently thermally stable that during the processing of the MTJ device 500 there is little chemical or physical interaction with the storage electrode 510. It is also preferred that the underlayer have an amorphous or polycrystalline fine-grained structure, so that crystallization of the amorphous layer 515 comprising the reference ferromagnetic electrode deposited on the underlayer 512 is not encouraged.

The storage magnetic electrode 510 is formed on the underlayer 512 by deposition of a layer 515 comprising an amorphous ferromagnetic alloy. The electrode may be formed from a wide variety of amorphous ferromagnetic materials but particularly the family of 3d transition metal ferromagnetic alloys combined with glass forming elements, such as B, Hf, Zr and Si. In FIG. 11 a layer 515 of CoFeB is deposited which is 60 Å thick. The composition of the layer as determined by RBS analysis is $CO_{57}Fe_{23}B_{20}$ (or $(CO_{60}Fe_{40})_{80}B_{20}$ where a sputtering target with a nominal composition of $CO_{59.5}Fe_{25.5}B_{15}$ was used). An interface layer 520 of a crystalline CoFe alloy may also be used. In FIG. 11 a layer 520 of 15 Å of $CO_{70}Fe_{30}$ was formed. The magnetic moments of the layers 515 and 520 are strongly exchange coupled so the bilayer behaves as a single ferromagnetic layer whose magnetization direction is given by the double headed arrow 521.

A MgO tunnel barrier 540 is then formed according to the methods described in U.S. patent application Ser. No. 10/824,835 to Parkin titled "MgO tunnel barriers and method of formation" (filed Apr. 14, 2004) and Ser. No. 10/646,246 to Parkin titled "MgO tunnel barriers and method of formation" (filed Aug. 22, 2003). First a layer of 8 Å Mg is formed followed by 27 Å MgO which is formed by deposition of Mg in an argon-oxygen plasma containing 3 percent oxygen. Finally the MTJ device is completed by forming the reference magnetic electrode 560 and a capping layer 590. The reference electrode 560 in FIG. 11 is an exchange biased ferromagnetic layer. The ferromagnetic layer may be comprised of one or more layers of ferromagnetic and non-ferromagnetic materials provided that the ferromagnetic layers are coupled to one another either ferromagnetically or antiferromagnetically. An interface layer 555 may first be formed from a crystalline CoFe alloy followed by an amorphous layer 565 comprised of, for example, a CoFeB alloy. These layers will be strongly ferromagnetically exchange coupled so that their net magnetic moment direction may be represented by the arrow 561. An exchange bias layer 580 is formed on top of the amorphous layer 565 which fixes the direction of the magnetic moment of the reference electrode shown by the arrow 561.

Figure 12:
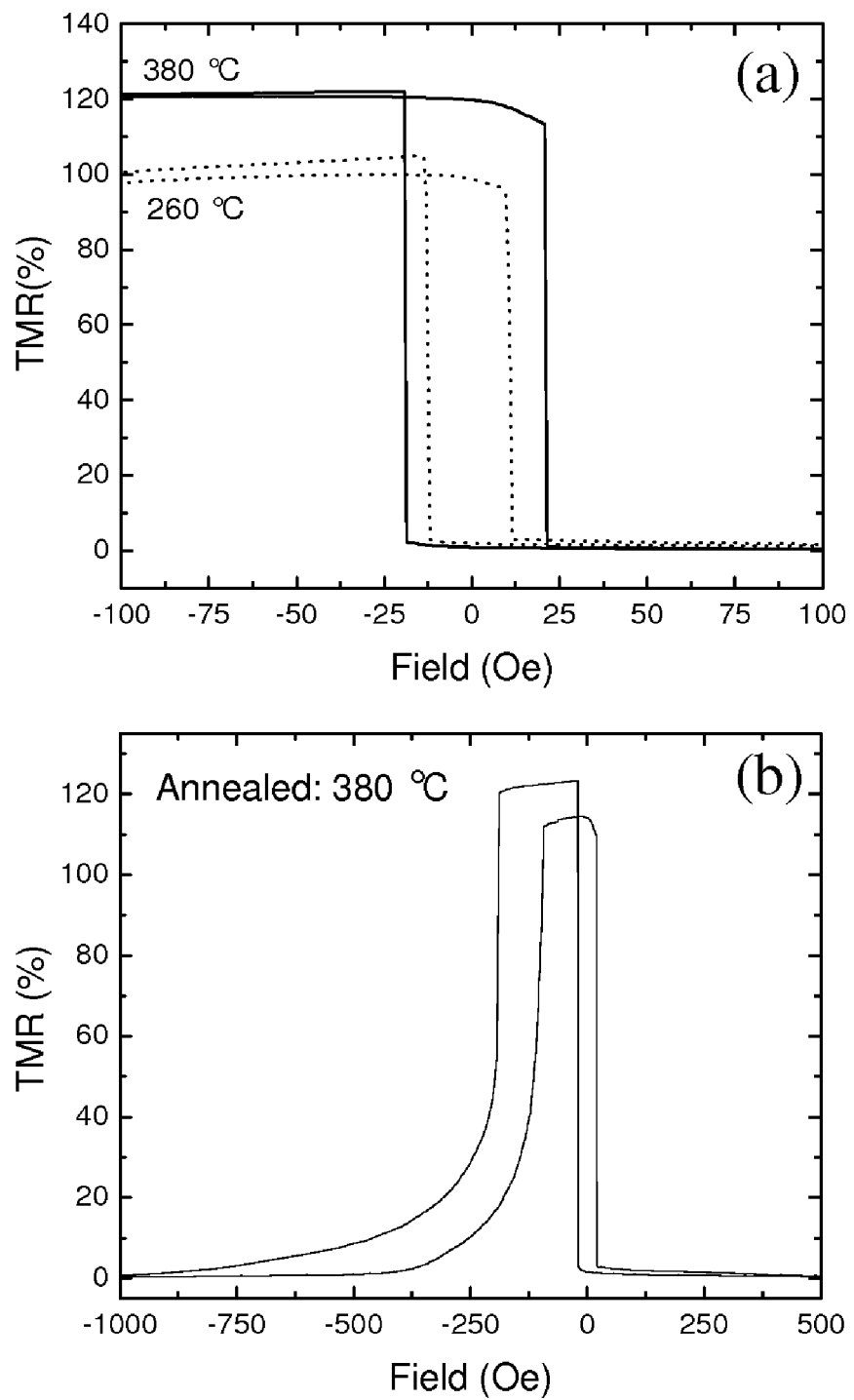
FIG. 12, which includes

Typical resistance versus field curves for an MTJ device formed according to the structure of FIG. 11 are shown in FIG. 12. The reference electrode is formed from a single layer 555 of 80 Å of $Co_{70}Fe_{30}$, without the layer 565. The exchange bias layer 580 is formed from 250 Å $Ir_{25}Mn_{75}$. A capping layer 590 of 100 Å TaN and 75 Å Ru was used. The device exhibits a tunneling magnetoresistance of 120% after it has been annealed at a succession of temperatures to a final anneal temperature of 380° C. The device shows more than 100% TMR after a first anneal at 260° C. for 90 minutes. The device shows excellent magnetic properties with very square magnetic hysteresis loops as shown in FIG. 12A. The coercive field is only a little increased even after annealing at 380° C. so that the device shows remarkable thermal stability.

Figure 13:
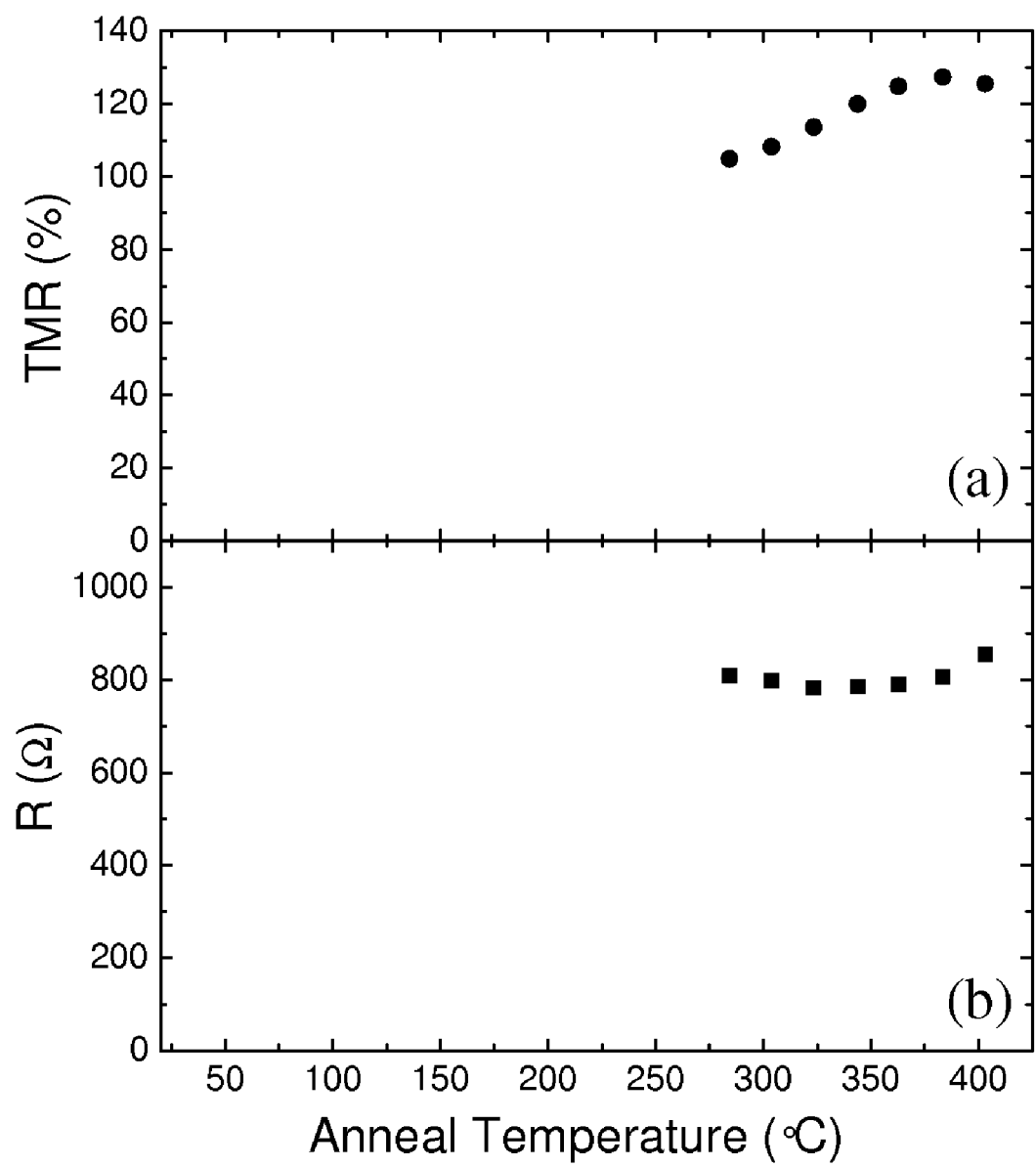
FIG. 13, which includes

The detailed dependence of TMR and resistance, measured at room temperature, versus anneal temperature are shown in FIG. 13 for a typical shadow masked magnetic tunnel junction device. The TMR increases as the anneal temperature is increased from 280° C. to 380° C. and then is slightly reduced for a higher annealing temperature at 400° C. The resistance of the junction changes little even for anneals at temperatures of 400° C.

Figure 14:
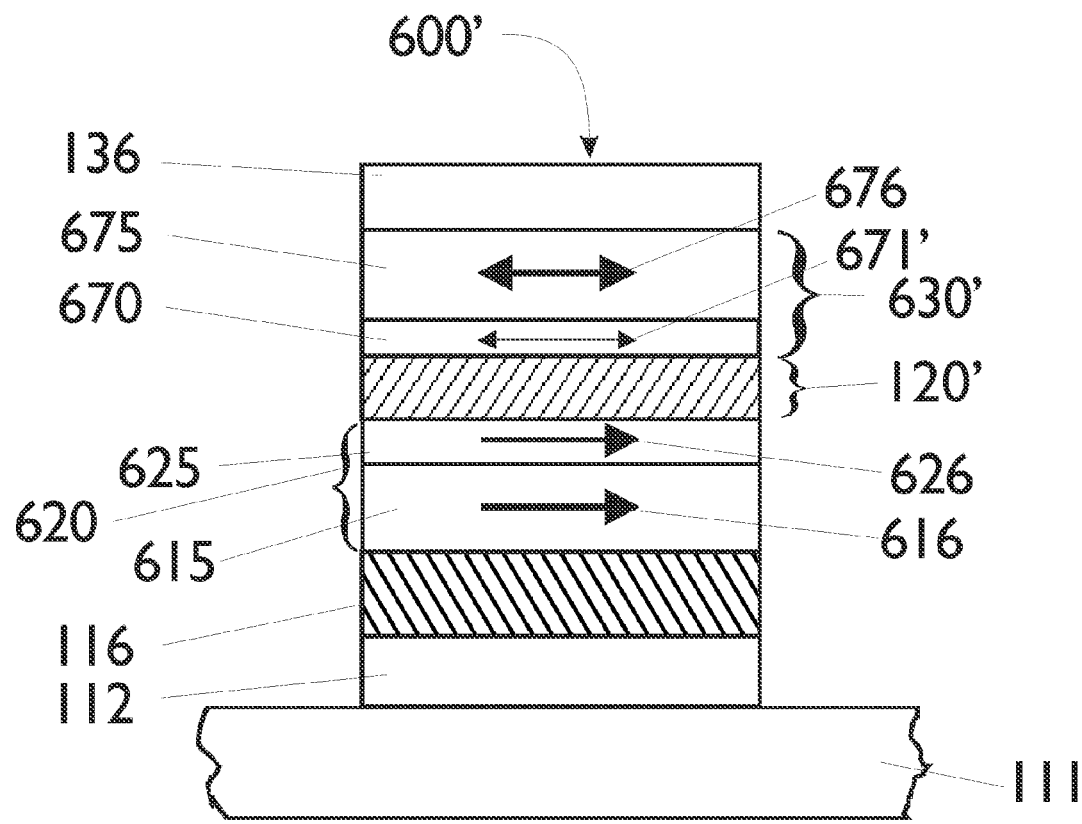
FIG. 14 shows one preferred embodiment in which amorphous magnetic materials are positioned on both sides of a tunnel barrier.

The MTJ structure of FIG. 11 is formed with an amorphous ferromagnetic storage layer under the MgO tunnel barrier, whereas the structure of FIG. 3 is formed with an amorphous storage layer above the MgO tunnel barrier. Amorphous ferromagnetic layers can surprisingly be used both above and below the crystalline MgO tunnel barrier. Evidently, the reason why amorphous ferromagnetic layers can be used beneath the MgO tunnel barrier is that films of MgO deposited on smooth amorphous underlayers form highly (100) textured crystalline layers. This is because the (100) surface of MgO has the lowest surface energy and is the preferred crystalline texture of MgO films. Furthermore, it is highly likely that the amorphous underlayer becomes partially crystallized due to its proximity to the MgO tunnel barrier. Thermal anneal treatments are also likely to encourage the interface of the amorphous ferromagnetic underlayer to crystallize. Thermal anneal treatments may also cause the glass forming constituent of the amorphous ferromagnetic alloy (for example, boron in a CoFeB alloy) to diffuse away from the CoFeB/MgO interface, thus leading to a CoFe rich alloy at the interface with the MgO and so lowering the crystallization temperature of the interface layer. Thus a preferred structure of the current invention is shown in FIG. 14 in which an MTJ is formed with two ferromagnetic layers both comprised of amorphous ferromagnetic alloys. The structure shown in FIG. 14 is one in which the lower ferromagnetic electrode 620 forms the reference magnetic electrode and here is exchange biased using a thin layer of IrMn 116. The substrate 111 is formed from amorphous $SiO_2$ thermally grown on a silicon substrate. The layer 116 is formed from an antiferromagnetic layer of an $Ir_xMn_{1-x}$ alloy which is sufficiently thick that its blocking temperature is well above the operating temperature of the MTJ device 600'. The thickness of the IrMn layer is optimized with regard to the magnetic properties of the device, the growth and texture of the MTJ device, and the fabrication and integration of lithographically defined devices. For example, it may be advantageous to make the layer 116 thin if this layer is to be chemically or physically etched during the fabrication of the MTJ device, in order to reduce the possibility of redeposited material on the edges of the device. Alternatively, the layer 116 may be made thicker if it is preferred to stop the etching of the device within the layer 116, i.e., to ensure that all the magnetic material from the lower electrode 620 is removed during the etching process. For these reasons, the thickness of the layer 116 may be in the range from ~75 to 300 Å.

The lower ferromagnetic electrode 620 in FIG. 14 is formed from a layer of an amorphous ferromagnetic layer 615 which may be preferentially formed from a $(Co_{1-x}Fe_x)_{1-y}B_y$ alloy. The B is a glass forming element whose content y is chosen so that the alloy is amorphous. The alloy will crystallize above a temperature which depends on the B content and is increased the greater the B concentration. The B content is typically in the range from 10 to 30 atomic percent, with a preferred concentration in the range from 10-25 atomic percent and, more preferably, in the range from 15 to 20 atomic percent. The ratio of Co to Fe can vary widely but is preferably chosen so that x is in the range from 10 to 99 atomic percent, but is preferably in the range from 20 to 50 atomic percent, and more preferably in the range from 25 to 35 atomic percent. This ratio of Co to Fe is preferably chosen so that the CoFe alloy, without the glass forming element, takes up a bcc crystal structure.

The lower ferromagnetic electrode 620 may also contain a thin crystalline ferromagnetic interface layer 625 in addition to the amorphous ferromagnetic layer 615. The amorphous layer 615 may itself be comprised of two or more layers of amorphous ferromagnetic materials. The layer 620 may be formed from a CoFe alloy where the Fe content is chosen so that the alloy (without the glass forming element(s), such as boron) would preferentially form a bcc crystalline structure. The Fe content of the $Co_{1-x}Fe_x$ layer is preferentially in the range from 10 to 99 atomic percent Fe, and is more preferably in the range from 20 to 50 atomic percent Fe, and is still more preferably in the range from 25 to 35 atomic percent Fe. The tunnel barrier 120' is preferably formed from MgO or Mg—ZnO using the methods described in U.S. patent application Ser. No. 10/824,835 to Parkin titled "MgO tunnel barriers and method of formation" (filed Apr. 14, 2004) and Ser. No. 10/734,425 to Parkin titled "Mg—Zn oxide tunnel barriers and method of formation" (filed Dec. 12, 2003).

The upper ferromagnetic electrode 630' which here forms the storage layer of an MTJ magnetic memory device is formed from an amorphous ferromagnetic layer 675, which is preferably formed from a $(Co_{1-x}Fe_x)_{1-y}B_y$ alloy whose composition is chosen for the same reasons described above for the layer 615. The electrode 630' may also contain a thin crystalline ferromagnetic layer (at the interface with the tunnel barrier 120'), which is preferably comprised of a bcc ferromagnetic alloy of CoFe.

The device 600' is capped with a capping layer 136. This layer serves various purposes, including improving the thermal stability of the device 600', improving the magnetic properties of the storage layer 630', and for the purpose of integration of the device 600' into a memory device.

Figure 15:
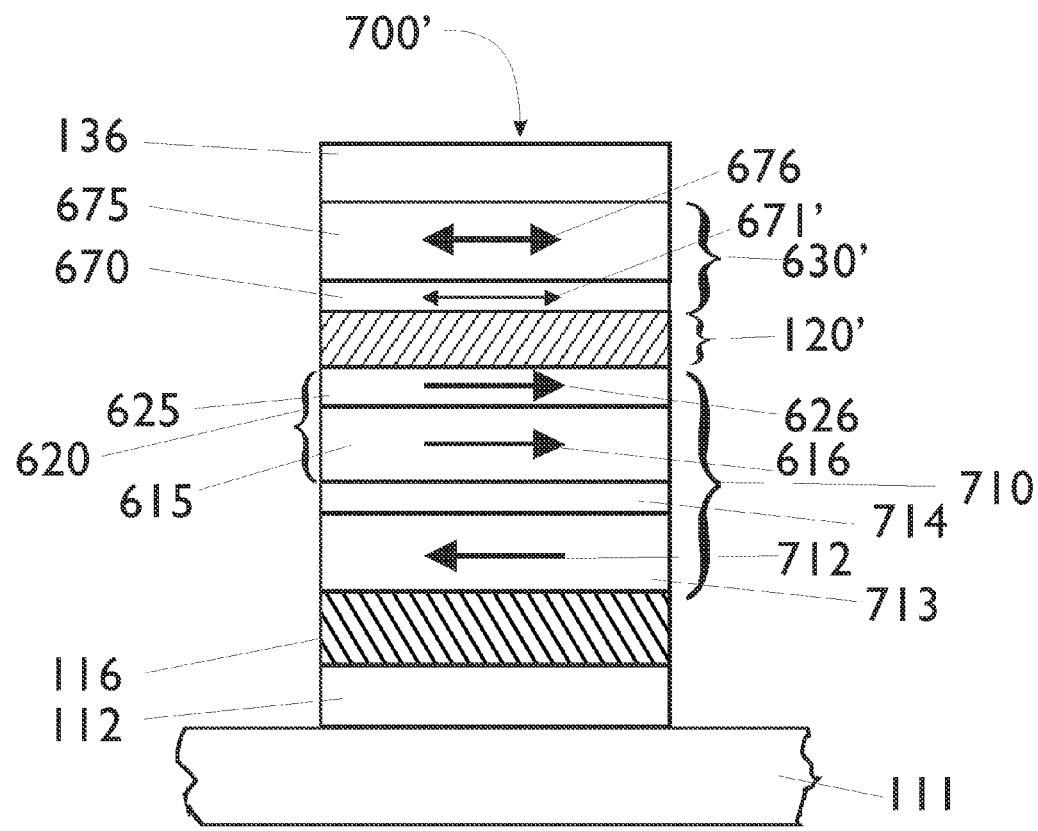
FIG. 15 shows another preferred embodiment in which amorphous magnetic materials are positioned on both sides of a tunnel barrier.

Since the MgO and/or Mg—ZnO tunnel barrier can be grown crystalline and highly (100) textured on an amorphous ferromagnetic layer as shown in the devices of FIG. 11 and FIG. 14, this allows for a wide variety of devices incorporating MgO and Mg—ZnO and other related tunnel barriers where there is no need to use crystalline ferromagnetic layers nor crystalline non-magnetic spacer and interface layers. In particular, another device of the current invention is shown in FIG. 15. This device uses a synthetic antiferromagnetic reference layer as described in U.S. Pat. No. 5,465,185 to Parkin and Heim with reference to metallic spin-valve giant magnetoresistance sensors, and in U.S. Pat. No. 5,841,692 to Gallagher et al. with reference to magnetic tunnel junction devices for sensor and memory applications, and in U.S. patent application Ser. No. 10/884,696 to Parkin filed Jul. 2, 2004 and titled "Magnetic tunnel barriers and associated magnetic tunnel junctions with high tunneling magnetoresistance" (this application is hereby incorporated herein by reference), which describes MTJs with crystalline MgO tunnel barriers and crystalline synthetic antiferromagnetic reference layers using bcc antiferromagnetic coupling layers.

The synthetic antiferromagnetic reference layer 710 of the device shown in FIG. 15 uses two ferromagnetic and/or ferrimagnetic layers 713 and 620 separated by a thin antiferromagnetic coupling layer 714. The layer 713 may be comprised of either a crystalline or an amorphous ferromagnetic or ferrimagnetic material. For example, the layer 713 may be comprised of an alloy formed from one or more of Co, Ni and Fe. A preferred alloy is an alloy of Co and Fe with an Fe concentration in the range from 10 to 30 atomic percent. The layer 714 couples the magnetization of the layers 713 and 615 antiparallel to one another in zero or small magnetic fields as illustrated by the arrows 712 and 616. The antiferromagnetic coupling layer may be formed from either a crystalline or amorphous material. Preferred materials include Ru as described in U.S. Pat. Nos. 5,465,185 and 5,841,692, and Os and alloys of Ru and Os as described in U.S. Pat. No. 6,153, 320 to Parkin titled "Magnetic devices with laminated ferromagnetic structures formed with improved antiferromagnetically coupling films". The layers 615, 625, 120', 670, 675 and 136 correspond to those shown in the device of FIG. 14.

The structure of FIG. 15 thus uses a synthetic antiferromagnetic sandwich comprised of amorphous ferromagnetic layers separated by a thin layer of Ru. Crystalline ferromagnetic interface layers may be formed at the interfaces with the tunnel barrier 120'. There may also be interface layers of non-ferromagnetic, non-ferrimagnetic layers for the purposes of improved properties, whether, magnetic, magneto-transport or structural, or for improved thermal stability or integratability. The fact that MgO and MgZnO tunnel barriers will form highly textured (100) oriented layers on amorphous layers (whether ferromagnetic, ferrimagnetic or non-magnetic) allows for a greater diversity of ferromagnetic, ferrimagnetic and non-magnetic layers to be used in the reference and storage electrodes of the MTJ device.

The tunneling magnetoresistance of the devices of FIGS. 14 and 15 may be improved by thermal anneal treatments, preferably at temperatures in the range from 200 to 400° C. and, more preferably, in the range from 250 to 350° C. Tunneling magnetoresistance values of these devices, after suitable thermal anneal treatments, exceed 50% or 100% or 160% or 200%.

Although examples of the various embodiments of the current invention have been described with regard to the use of MgO tunnel barriers, the MgO tunnel barrier may be replaced by a barrier formed from $Mg_{1-x}Zn_xO$ or from a barrier comprised of multiple layers of $Mg_{1-x}Zn_xO$, where x is varied from layer to layer or may be formed from one or more layers of MgO and $Mg_{1-x}Zn_xO$. (See U.S. application Ser. No. 10/734,425 to Parkin titled "Mg—Zn oxide tunnel barriers and method of formation" filed Dec. 12, 2003.)

Figure 16:
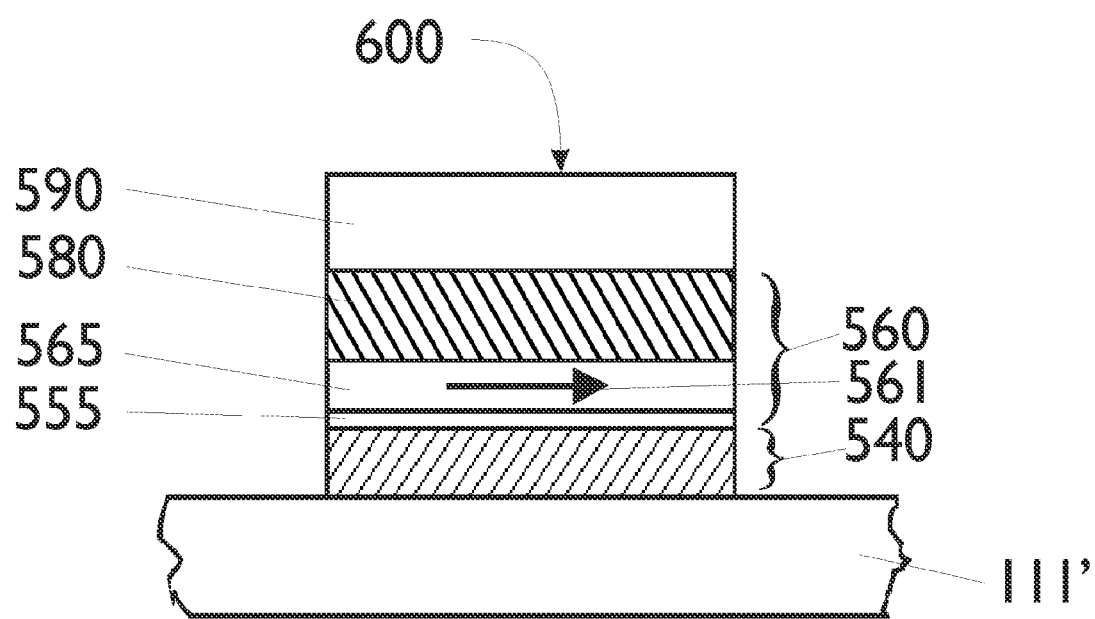
FIG. 16 shows a cross-sectional view of a tunnel spin injector of the present invention.

The use of amorphous ferromagnetic materials in combination with MgO or MgZnO tunnel barriers is not limited to magnetic tunnel junctions but may also be used to create improved tunnel spin injectors. The structure and method of formation of tunnel spin injectors for spintronic devices using MgO tunnel barriers is described in U.S. patent application Ser. No. 10/646,247 to Parkin titled "MgO-based tunnel spin injectors", filed Aug. 22, 2003, which is hereby incorporated by reference. An exemplary tunnel spin injector 600 is described in FIG. 16. The tunnel barrier 540 and the layers 555, 565, 580 and 590 correspond to those of the magnetic tunnel junction device 500 of FIG. 11, but the tunnel barrier 540 is deposited onto a semiconducting substrate 111'. The substrate may be formed from GaAs, AlAs, or $As_{1-x}Ga_xAs$, for example. The tunnel spin injector formed from the MgO or MgZnO tunnel barrier, here in combination with an amorphous CoFe based alloy ferromagnetic electrode, gives rise highly spin polarized electrical current which can be injected into the semiconducting substrate. Thus this improved tunnel spin injector has advantages for a wide variety of spin-based electronic devices (spintronic devices).

Similarly, the MgO tunnel barrier could be replaced by one of the family of simple cubic or zinc blende tunnel barriers including ZnS, ZnSe and ZnTe, CdS, CdSe and CdTe, and AlAs and related materials including insulating $Al_{1-x}Ga_xAs$. These materials will grow in a highly textured crystallographic orientation on bcc ferromagnetic metals.

While the preferred embodiments of the current invention apply to structures with (100) texturing for the highest possible TMR or spin polarization values, the structures and devices described herein may be prepared in other crystallographic orientations, and so be advantageous in other regards.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method, comprising:
   forming a tunnel barrier selected from the group of tunnel barriers consisting of MgO and Mg—ZnO;
   forming first and second amorphous ferromagnetic layers in proximity with respective underlayers by depositing Co and at least one other element on each of the underlayers, wherein the amorphous layers and the tunnel barrier are formed in proximity to one another to permit spin-polarized current to pass between the first and second amorphous layers through the tunnel barrier, thereby forming a magnetic tunnel junction, the magnetic tunnel junction having a tunnel magnetoresistance of at least 100% at room temperature; and
   forming in proximity with the second amorphous layer at least one of the following: i) an antiferromagnetic layer that exchange biases the second amorphous magnetic layer, and ii) an additional magnetic layer and an antiferromagnetic coupling layer in proximity with the second amorphous magnetic layer, so that the additional magnetic layer, the coupling layer, and the second amorphous magnetic layer form a synthetic antiferromagnet reference layer, wherein the coupling layer couples the second amorphous magnetic layer and the additional magnetic layer.

2. The method of claim 1, wherein said at least one other element includes B.

3. The method of claim 1, wherein said at least one other element includes Zr.

4. The method of claim 1, wherein said at least one other element includes Hf.

5. The method of claim 1, wherein ferromagnetic crystalline layers are in contact with the tunnel barrier, each of the ferromagnetic crystalline layers contacting one of the amorphous layers.

6. The method of claim 1, wherein the tunnel barrier is (100) oriented.

7. The method of claim 1, comprising annealing the junction to increase its tunneling magnetoresistance.

8. The method of claim 7, wherein the junction is sufficiently free of defects and deleterious oxide, that the magnetic tunnel junction has a tunnel magnetoresistance of greater than 120% at room temperature.

9. The method of claim 7, wherein the junction is annealed at a temperature selected to yield a tunnel magnetoresistance of greater than 160% at room temperature.

10. The method of claim 7, wherein the junction is annealed at a temperature selected to yield a tunnel magnetoresistance of greater than 200% at room temperature.

11. The method of claim 7, wherein the junction is annealed at a temperature greater than 260° C.

12. The method of claim 7, wherein the junction is annealed at a temperature greater than 300° C.

13. The method of claim 7, wherein the junction is annealed at a temperature greater than 340° C.

14. The method of claim 7, wherein the junction is annealed at a temperature greater than 380° C.

15. The method of claim 7, wherein the junction is annealed at a temperature greater than 400° C.

16. The method of claim 1, wherein the tunnel barrier includes a MgO tunnel barrier.

17. The method of claim 16, wherein the MgO tunnel barrier is formed by:
   depositing Mg onto a surface of an underlayer to form a Mg layer thereon, wherein the surface is selected to be substantially free of oxide; and
   directing additional Mg, in the presence of oxygen, towards the Mg layer to form a MgO tunnel barrier in contact with the surface, the oxygen reacting with the additional Mg and the Mg layer.

18. The method of claim 1, wherein the tunnel barrier includes a Mg—ZnO tunnel barrier.

19. The method of claim 18, wherein the Mg—ZnO tunnel barrier is formed by:
   depositing a metal layer onto a surface of an underlayer, wherein the surface is selected to be substantially free of oxide; and
   directing additional metal towards the metal layer, in the presence of oxygen, to form a magnesium-zinc oxide tunnel barrier in contact with the surface, the oxygen reacting with the additional metal and the metal layer, wherein:
at least one of the metal layer and the additional metal includes Zn, and
at least one of the metal layer and the additional metal includes Mg.

20. The method of claim 1, wherein at least one of the amorphous ferromagnetic layers is formed directly on the tunnel barrier.

21. The method of claim 1, wherein the tunnel barrier is formed directly on one of the amorphous ferromagnetic layers.

* * * * *